(12) United States Patent
Etoh et al.

(10) Patent No.: US 6,972,795 B1
(45) Date of Patent: Dec. 6, 2005

(54) HIGH-SPEED IMAGING DEVICE

(75) Inventors: Takeharu Etoh, Mino (JP); Hideki Mutoh, Odawara (JP)

(73) Assignees: Hispec Goushi Kaisha, Osaka (JP); Shimadzu Corporation, Kyoto (JP)

(*) Notice: Subject to any disclaimer, the term of this patent is extended or adjusted under 35 U.S.C. 154(b) by 0 days.

(21) Appl. No.: 09/554,882

(22) PCT Filed: Sep. 21, 1999

(86) PCT No.: PCT/JP99/05146

§ 371 (c)(1),
(2), (4) Date: May 22, 2000

(87) PCT Pub. No.: WO00/17930

PCT Pub. Date: Mar. 30, 2000

(30) Foreign Application Priority Data

Sep. 22, 1998 (JP) .................................. 10/268010
Oct. 29, 1998 (JP) .................................. 10/308648

(51) Int. Cl.[7] .............................................. H04N 3/14
(52) U.S. Cl. ....................................... 348/311; 348/315
(58) Field of Search ........................ 348/294, 311, 303, 348/316, 319, 320, 301

(56) References Cited

U.S. PATENT DOCUMENTS

| | | | | |
|---|---|---|---|---|
| 5,355,165 A | * | 10/1994 | Kosonocky et al. | 348/311 |
| 5,614,744 A | * | 3/1997 | Merrill | 257/291 |
| 6,091,091 A | * | 7/2000 | Moon | 257/233 |
| 6,118,483 A | * | 9/2000 | Etoh | 348/315 |
| 6,157,016 A | * | 12/2000 | Clark et al. | 250/208.1 |
| 6,157,408 A | * | 12/2000 | Etoh | 348/316 |
| 6,674,470 B1 | * | 1/2004 | Tanaka et al. | 348/302 |
| 2001/0010551 A1 | * | 8/2001 | Dierickx | 348/241 |

FOREIGN PATENT DOCUMENTS

| | | |
|---|---|---|
| EP | A2809393 | 11/1997 |
| JP | A-5284282 | 10/1993 |
| JP | A-11225288 | 8/1999 |

OTHER PUBLICATIONS

Takeharu Etoh, Kohsei Takehara, "An in-situ storage image sensor 1,000,000 pps with an elongated CCD strip under each photodetector", SPIE vol. 2869, 1997.*

(Continued)

*Primary Examiner*—Wendy R. Garber
*Assistant Examiner*—Nelson D. Hernandez
(74) *Attorney, Agent, or Firm*—Birch, Stewart, Kolasch & Birch, LLP

(57) ABSTRACT

A high-speed image sensor has a plurality of signal converting means (30) for generating electric signals corresponding to an incident light intensity and a plurality of electric signal recording means (33) for recording electric signals output from corresponding signal converting means (30). The electric signal recording means (33) is linearly shaped and has a read-out line (58a) for each of longitudinal sections thereof. The read-out line (58) is used for directly reading out the electric signals out of a light receptive area.

23 Claims, 23 Drawing Sheets

OTHER PUBLICATIONS

Takeharu Etoh, "An Improved Design of an ISIS for a Video Camera of 1,000,000 pps", SPIE vol. 3642, 1999.*

Takeharu Etoh, " Ultra high-speed multiframing camera with an automatic trigger", SPIE vol. 1757, 1992.*

Takehary Etoh, "A CCD Image Sensor of 1Mframes/s for Continuous Image Capturing 103 Frames", ISSCC 2002, 2002.*

Takeharu Etoh, "Specifications of highspeed image sensors based on requirements of multi-scientific fields", SPIE vol. 3173.*

Takeharu Etoh, "An ISIS with curved coupled CCD channels for a video camera of 1,000,000 pps", SPIE vol. 3516,1999.*

SPIE vol. 1757, Etoh, Takeharu et al. pp. 53-57, 1992.

Etoh, Takeharu, Kinki University. PP. 403-412, 1997.

* cited by examiner

HIGH-SPEED IMAGING DEVICE

This application is the national phase under 35 U.S.C. § 371 of PCT International Application No. PCT/JP99/05146 which has an International filing date of Sep. 21, 1999, which designated the United States of America.

TECHNICAL FIELD

The present invention relates to a high-speed image sensor and an image sensing apparatus fitted to continuous image sensing of high-speed phenomenon.

BACKGROUND ART

In a solid image sensing apparatus for the purpose of high-speed image sensing, the most critical factor deciding a image sensing speed is a time required to transfer image information generated at a photoelectric transferring apparatus such as a photodiode to a recording apparatus. Thus, most high-speed video cameras including cameras invented by the present inventor employ method of accelerating the speed of transferring image information from an image sensor to a recording apparatus by concurrently reading out the information using many read-out lines (e.g., see "4500 Frames/se. High-Speed Video Camera", by Takeharu ETOH, published at pp. 543–545 of Vol.46, No.5 (1992) of Journal of Television Society).

There is provided such a method for minimizing the time for transferring information to the recording apparatus that the recording apparatuses are disposed adjacent each of the photodiodes provided on the light receptive area of the image sensor, without reading out image information from the image sensor. In this case, the image information is transferred from all of the photodiodes at once to the recording apparatus, so that the information transfer is performed concurrently by a total number (usually, a few 10,000 to a few 1,000,000) of these photodiodes provided on the light receptive area. Therefore, a transfer speed at which image information is transferred from each photodiode to the adjacent recording apparatus provides an image sensing speed for each frame of an image. Further, its reciprocal number provides the number of frames per second (frame rate). The present inventor calls such a pixel peripheral recording type image sensor an ISIS (In-Situ Storage Image Sensor). With the ISIS, continuous image sensing is possible at an image sensing speed of equal to or more than 100 million frames/sec.

The image sensors are roughly categorized into an analog type for processing image information in such an analog format as charge or voltage and a digital type for processing it in a digital format.

Ideally, one AD converter is provided for each pixel to digitize image information from the beginning so that the subsequent processes may all be performed at a digital circuit. Further, an ultra-miniaturized AD converter that can be incorporated into each pixel being possible logically. However, miniaturizing the AD converter causes a drastic deterioration in the conversion accuracy. A repetitive sampling method etc. may be available for enhancing the conversion accuracy but may not fit ultrahigh-speed image sensing because it involves a lot of time-consuming repetitions.

Nevertheless, a digital type high-speed image sensor may be possible to manufacture in the future, taking into consideration that the above-mentioned pixel peripheral recording type imaging sensor has a large pixel size enough to reserve a space for incorporating therein an AD converter measuring a few tens of microns in length and also that a video camera with a frame rate of about one million frames/sec. can sufficiently be operated at a relatively low frequency of a few mega-Hertz.

The analog type image sensors may be categorized into two groups. The first type of an image sensor (hereinafter refereed to as MOS type or XY address type sensor) sends an image signal to a recording apparatus near a photoelectric converter via an electric wire through a MOS type switch. The second type of an image sensor (hereinafter refereed to as CCD type or transfer type sensor) uses a charge-coupled device type electric-signal transfer path (CCD transfer path) as a means for transferring an image signal to a recording apparatus in such a manner as to use this CCD transfer path as the recording apparatus.

The present inventors have provided a MOS type image sensor (see "Ultrahigh-speed multi-framing camera with an automatic trigger, Ultrahigh- and High-speed Photography and Photonics" by T. Etoh and K. Takehara, SPIE vol. 1757, pp. 53–59, 1992).

Although the MOS type sensor has been regarded as being inferior to the CCD type in noise level, a recently available MOS type sensor can obtain an improved SN ratio by incorporating an about 30-magnification amplifier into each pixel. This MOS type sensor is called a CMOS-APS (Active Pixel Sensor).

When a CMOS type device is employed as the pixel peripheral recording type image sensor, an amplifier should be ideally provided for each photodiode so that image information may be amplified before being transferred to a recording section. The currently available ultra-small amplifier cannot amplify a signal to a large extent at a high frequency. Like in the case of the digital type sensor, however, it may be highly possible to incorporate a 10-magnification-order amplifier at a stage before transfer to a recording section, taking into account a large pixel size and a relatively low frequency of a few mega-Hertz.

In the case of a MOS type image sensor, the larger the capacitance of a read-out line, the larger would be the random noise. However, in the case of a pixel peripheral recording type sensor having a few to a few tens of microns of its image information transfer distance, the random noise can be reduced to 1/1000 through 1/100 as compared to the case with a typical sensor of reading out the image information outside the light receptive area. Also, the cross-sectional area of a metal wire for use in information transfer can be substantially reduced by micro-machining. In this case, the random error may be smaller at the time of information transfer to a recording element in the periphery of pixels and an amplifier may be used for reading out a signal after completion of image sensing.

Time-wise invariable fixed-pattern noise (FPN) constitutes one problem in the MOS type image sensors. In particular, a CMOS-APS has such FPN due to irregularities in performance of the amplifier in each pixel. However, the FPN is not much of a problem in science and technological measurement. Namely, since it generally employs digital image processing after image sensing, the FPN can be canceled at the digital image processing.

In view of the above, it is highly possible to manufacture a CMOS type pixel peripheral recording type image sensor with current technologies.

One CCD type pixel peripheral recording type image sensor, shown in FIG. 23, has been invented by Kosonocky et al. (see U.S. patent application No. 5,355,165). This image sensor is capable of continuous photography at an even interval of 500,000 frames/sec. and capable of continuously capturing 30 image frames.

In a typical image sensor, a unit region consisting of one photodiode and one accompanying CCD transfer path is called one pixel. Alternately, one unit of image information stored in one CCD element is called one pixel. Kosonocky et al. refer to a unit region containing one photodiode 1, multi-element CCD transfer paths 5 and 6, a gate 3 necessary for operation, etc. which are all shown enclosed in a dotted line in FIG. 23 as a macro pixel 4. This is done so in order to discriminate from each other a macro pixel 4 and the above-mentioned each CCD element or each unit of image information accumulated therein. Hereinafter, one macro pixel is called one pixel.

First, charge generated at the photodiode 1 is transferred rightward in the horizontal CCD transfer path 5 by five steps, so that five elements of the horizontal CCD transfer path are all filled with charges. At the same time, the charges are transferred into the five parallel vertical CCD transfer paths 6 disposed below the horizontal CCD transfer path 5 in the figure. By repeating this operation, continuous images of 30 (5×6) frames can be stored.

One more operation of this vertical transfer permits five image signals stored in the lowest line of the five parallel vertical CCD transfer paths 6 to be shifted to a horizontal CCD transfer path 5b in pixels directly below. At the next step of transferring the charges from the photodiode 1 to the horizontal CCD transfer path 5, the image signals shifted from the upper pixel 4 to the horizontal CCD 5b are consecutively transported rightward and disposed into a drain 7 provided at the left top corner for each pixel in the figure (in this case, a drain 7c in the right bottom corner pixel 4) and then discharged out of the image sensor. Accordingly, 30 frames of the most recent image information are overwritten continuously.

This function of continuously overwrite-image sensing is extremely useful for synchronizing phenomenon occurrence and image sensing timing which is important in high-speed image sensing. That is, with this function, by stopping continuous overwrite-image sensing immediately after detection of phenomenon occurrence in an object, it is possible to reproduce image information at the time point of the phenomenon occurrence dating back to the past from the current time point. Although it is extremely difficult to start image sensing immediately before an ultrahigh-speed phenomenon in an object by anticipating it, the phenomenon occurrence can be detected readily, so that the image sensing can be stopped immediately thereafter.

In the image sensor shown in FIG. 23, however, there is a problem that the perpendicular change in charge transfer direction changes rapidly between horizontal and vertical directions in an alternating manner. Namely, when the perpendicular change in charge transfer direction takes place rapidly, incomplete transfer (residual charge) cannot be avoided, thus resulting in a deteriorated image quality. Also, an electrode layout at a portion where the transfer direction changes is complicated, resulting in noise occurrence. Further, the complicated electrode layout causes an increase in a size of each element on the CCD transfer path, so that the recording capacity (number of continuous image frames) is decreased unless the size of the pixel 4 is increased. If the pixel 4 is increased in size, on the other hand, the total number of the pixels for the same light receiving area is decreased, thus deteriorating the resolution.

FIGS. 24, 25A, and 25B show a pixel peripheral recording type image sensor invented by the present inventor (see Japanese Laid-Open Patent Publication No. Hei-9-55889, ETOH et al.: "Performance and Future of ISIS (Pixel Peripheral Recording Type Image sensor)", and ETOH et al.: Papers of Overall Symposium 1997 Lecture on High-Speed Photography and Photonics, pp 403–412, 1997).

In this image sensor, charge generated by a photodiode 8 is transferred through an input gate 9 to a. CCD transfer path 10, which has regularly provided meander portions 10a obliquely crossing between two photodiodes 8. In the CCD transfer path 10, the charge is transported vertically in one direction as long as six pixels and then discharged to a drain 15 through a drain gate 14. Consequently, the most recent information is continuously overwritten in each portion of the CCD transfer path 10 between the input gates 9 and the drain gates 14.

This image sensor involves one-directional transport of charge transfer and does not involve rapid changes in transfer direction, thus enabling complete transport of charges. Further, the electrode layout can be simplified, thus reducing the size of CCD elements and increasing the number of continuously overwriting image frames or the total number of pixels.

In this image sensor, however, its pixel layout is not square but shifts a little rightward. Since science and technological measurement involves a variety of digital image processing on captured images after image sensing, it is easy to convert a non-square layout into a square layout. However, since a smaller number of steps for image processing would produce less deterioration in image quality, it is preferable that the pixel layout be square.

Since the pixel peripheral recording type image sensor incorporates many recording elements in each pixel, the pixel size is a few times that with a usual image sensor, thus resulting in an extremely large sized light receiving area even with a device having a minimum required number of pixels for reproduction of images (about 256×256 pixels). This image sensor, which is generally called a large format sensor, has a small yield.

For example, the above-mentioned image sensor shown in FIG. 24 has, for each pixel, eight vertical CCD elements and six parallel horizontal CCD transfer paths 10. Therefore, in order to achieve a resolution of 256×256 pixels with this image sensor, about three million CCD elements (i.e., (256×8)×(256×6)=2048×1536) are required. Even with current technology, it is difficult to make a CCD type image sensor having three million elements without defect.

The CCD type image sensor generally has very small noise when charges are transferred. A defect in a CCD transfer path inhibits information stored in the pixels upstream side to the defect from being read out, thus resulting in a line-shaped defect and a large decrease in yield. In the CCD type image sensor, therefore, yield provides a largest problem in commercially producing the large format sensors. The MOS type image sensor, on the other hand, has larger noise in reading out information from a read-out line but manufacturing technology thereof is easier than that of the CCD type image sensor. Also, its defects appear as a dot-shaped defect per pixel. Such dot-shaped defect can be compensated by interpolation using image information obtained from pixels surrounding the pixel of dot-shaped defect.

Ultrahigh-speed image sensing requires very strong illumination and high-speed transfer causing generation of heat in the image sensor. These may contribute to deterioration of a vital sample or occurrence of thermal noise. The image sensing time of ultrahigh-speed image sensing is usually less than one second, so that the time consuming factors is image sensing condition such as image angle setting, focus setting and sensitivity regulation. With an electronic video camera, on the other hand, an image frame rate of about 30 frames/sec. is enough to reproduce continuously moving images and also to set image sensing conditions. Therefore, when setting the image sensing conditions, it is necessary to perform intermittent image sensing to prevent heat due to the illumination.

In the case that continuous image sensing at a rate of one million frames/sec. is performed, it is necessary only to give intermittent illumination of 30 times per second and having duration time of 1/1,000,000 with a stroboscope which has a peak light intensity equal thereto when image sensing. Further, by executing image sensing and transfer of the image information obtained thereby 30 times per second in synchronization with the intermittent illumination, motion images can be reproduce with a monitor display. This motion image is as smooth as a general television image, thus enabling trouble-free setting of the image sensing conditions. Further, in this case, a total time including a total illumination in setting of image sensing condition and operation time of the image sensor is drastically reduced to 30/1,000,000 of that for continuous image sensing. Thus, even if one hour (3,600 seconds) is required for setting of the image sensing conditions, a total illumination time is only 3,600×30/1,000,000 second, i.e. 0.1 second.

In a CCD type image sensor, in order to reproduce an image, the image information stored in the CCD elements including unnecessary information must consequently be read out of the image sensor once. The large format sensor requires high-speed transfer to read out all the image information therefrom, thus causing heating. Therefore, to perform intermittent image sensing at the time of setting the image setting condition with the pixel peripheral recording type image sensor using CCD transfer paths as its recording means, the image information needs to be read out of the image sensor rapidly.

In science and technological measurement, image measurement involves use of, in addition to visible light, ultraviolet ray, infrared ray, X-ray, gamma ray and other electromagnetic waves, electron stream, neutron stream, ion stream, and other particle streams.

DISCLOSURE OF INVENTION

In view of the above, it is an object of the present invention to provide a high-speed image sensor comprising: a plurality of signals converting means for generating electric signals in response to an intensity of an incident light, incoming ultraviolet, infrared, X-ray or other electromagnetic waves, electron stream, ion stream, or other particle streams; and a plurality of electric-signal recording means for recording the electric signals output from each of the plurality of signal converting means, wherein the above-mentioned electric-signal recording means is line shaped and provided with a read-out line for each of longitudinal section sections thereof, the read-out line being used for directly reading out the electric signals out of a light surface. "Line shaped" here means that each of the electric-signal recording means corresponding to each of the signal converting means is straight-line shaped but has a bend or curve partially.

The image sensor according to the present invention, even if a defect exists within a section of the electric-signal recording means, is capable of directly reading out of the light receptive area electric signals generated at a pixel present above that defect, so that defects in a reproduced image caused by that defect can be limited to those dot-shaped ones. The dot-shaped defects can be corrected using the image information of the surrounding pixels. This leads to improvements in production yield.

Preferably, such a recording means is provided that is directly connected from each of the signal converting means to the read-out line without passing through the electric-signal recording means.

With such a construction, at the time of setting image sensing conditions by an intermittent illumination, instead of reading out all image information in the electric-signal recording means, instantaneous image information only upon the intermittent illumination can be read out to monitor the image sensing state under almost the same conditions as those at the time of ultrahigh-speed image sensing performed after the setting of the image sensing apparatus, while preventing the occurrence of thermal noise in the case where the electric-signal recording means is a charge-coupled type electric-signal transfer path and the deterioration of vital samples.

It is another object of the present invention to provide a high-speed image sensor comprising: a plurality of signal converting means for generating electric signals according to an incident light intensity and a plurality of electric signal recording means for storing electric signals output from corresponding signal converting means, wherein said signal converting means are disposed in all of or every other square or rectangular frames on a light receptive area; and wherein a center line of said electric signal means is inclined with respect to a line connecting two positions where electric signals are input from two of said signal converting means adjacent to each other in an extension direction of said electric signal recording means to corresponding electric signal recording means. "Inclined" means that the centerline of the above-mentioned electric-signal recording means is neither parallel nor perpendicular to the above-mentioned straight line.

In this case, the pixels are given in a square array. A device with a square pixel array is easy not only in image processing after completion of image sensing but also in creation of a cut-out line for cutting out a large format sensor for improvements in yield.

For example, the above-mentioned electric-signal recording means may be a charge-coupled device type electric-signal transfer path.

In this case, the most recent image information (charge) generated by the signal converting means for each pixel can be transferred in one direction on a charge-coupled device type electric transfer path provided in periphery at a high speed and stored, thus providing ultrahigh-speed continuous overwrite image sensing.

The above-mentioned electric-signal recording means may also be a MOS type one.

In this case, during image sensing, charges generated at the signal converting means for each pixel can be sequentially stored at the peripheral MOS type electric-signal recording means, thus providing ultrahigh-speed continuous overwrite image sensing.

Preferably, the signal converting means each are divided into a plurality of portions insulated from each other.

In this case, even if a potential gradient is provided at each of thus divided portions of the signal converting means for the purpose of accelerating the collection of charges, a potential between the electric-signal recording means and the signal converting means does not become excessively large, thus securely sending electric signals generated at the signal converting means over to the electric-signal recording means. Also, since each divided portion of each signal converting means may be small in area, a photodiode with each side of about a few microns to more than 10 microns, which has sure quality and is presently available, can be used to constitute the signal converting means.

Also, in such a configuration that the electric-signal recording means is a MOS type electric-signal recording one and the signal converting means is divided into a plurality of portions, an amplification means is preferably interposed between thus divided respective portions and the electric-signal recording means.

When a transistor is used as the amplification means, the larger is size perpendicular to an intersection with a charge flowing direction (width), the higher would be the amplification efficiency. However, if the width is too large with respect to the current flowing directional size (length), it is difficult to maintain uniformity of a width-directional potential. If the signal converting means is divided into a plurality of portions, on the other hand, the amplification means each have a smaller width but has a large total of the widths of the plurality of amplification means and, at the same time, the width of each amplification means does not becomes too large with respect to its length, thus acquiring uniformity of the width-directional potential. Therefore, with such a configuration, the amplification means may have an improved amplification efficiency and a larger allowable charge quantity.

Such a configuration is preferable that a band-shaped space is provided which can be cut off and continues from one side to another of the light receptive area.

In this case, if the large format sensor has partially a defect, only the defect-free portions can be cut out and used as a low-resolution, inexpensive small device. Moreover, these portions can be combined into a device equivalent to the large format sensor. It results in that image sensing at an ultrahigh speed continuous images as many frames as necessary for continuous motion image reproduction at a relatively high resolution can be executed.

It is still another object of the present invention to provide an image sensing apparatus provided with the above-mentioned high-speed image sensor. Such an image sensing apparatus provides a compact and inexpensive ultrahigh-speed video camera with a frame rate of 1 million frames/sec.

BEST MODE FOR CARRYING OUT THE INVENTION

First Embodiment

FIGS. 1 to 5 show a high-speed image sensor according to the first embodiment of the present invention.

Figure 1:
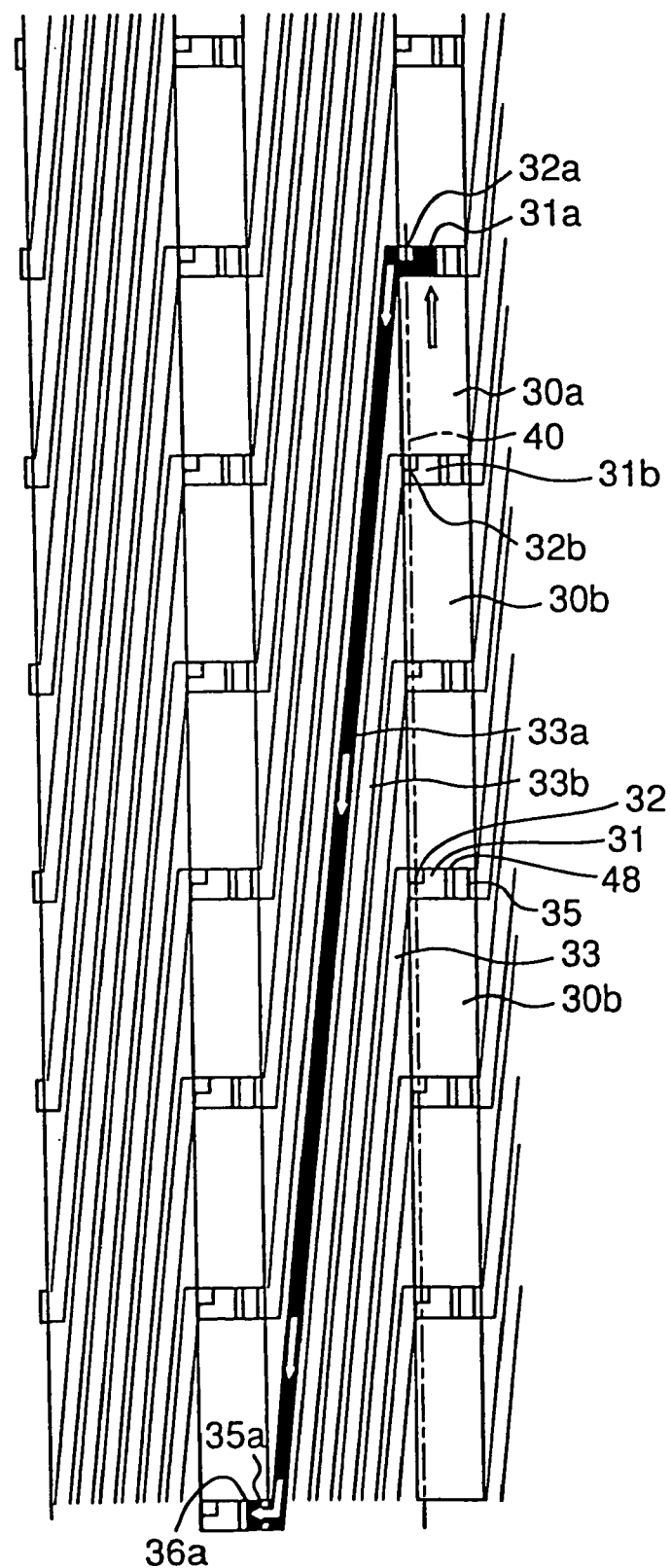
FIG. 1 is a partial schematic front view showing a light receptive area of a high-speed image sensor according to the first embodiment.
Figure 2:
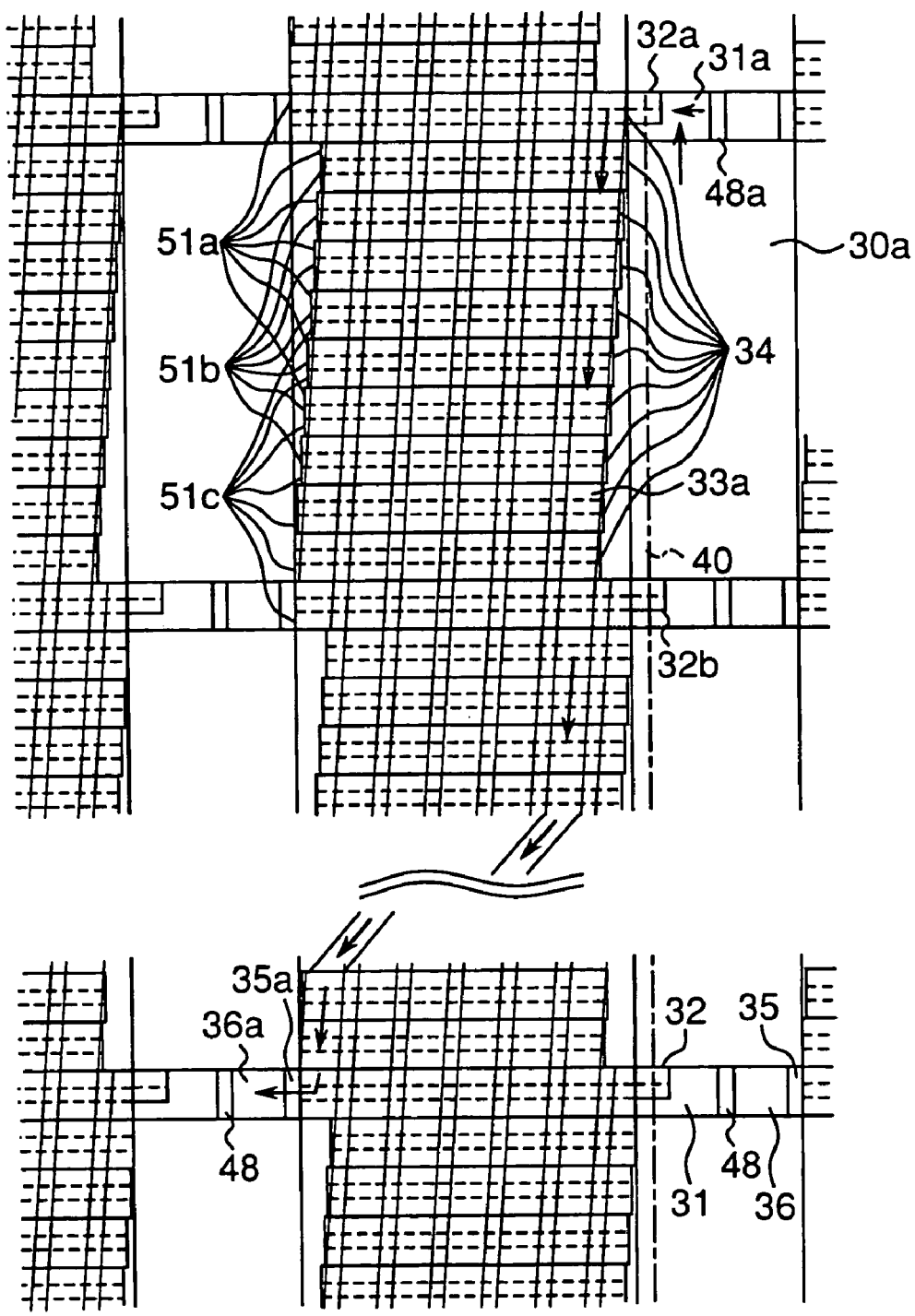
FIG. 2 is a partial schematic view showing a layout of polysilicon electrodes in the high-speed image sensor according to the first embodiment.
Figure 3:
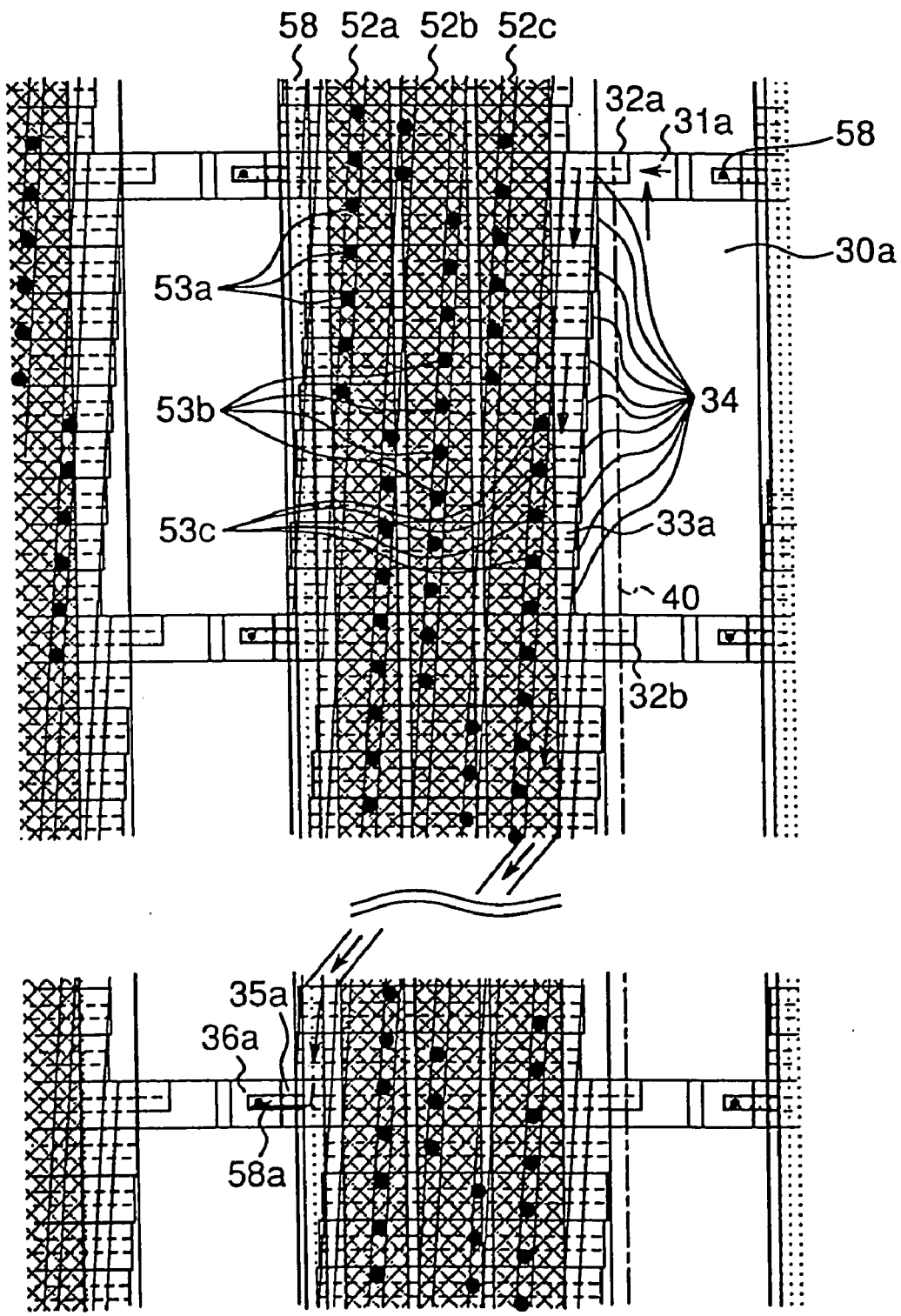
FIG. 3 is a partial schematic front view showing wiring of metal wires for delivering CCD transfer driving voltage in the high-speed image sensor according to the first embodiment.
Figure 4:
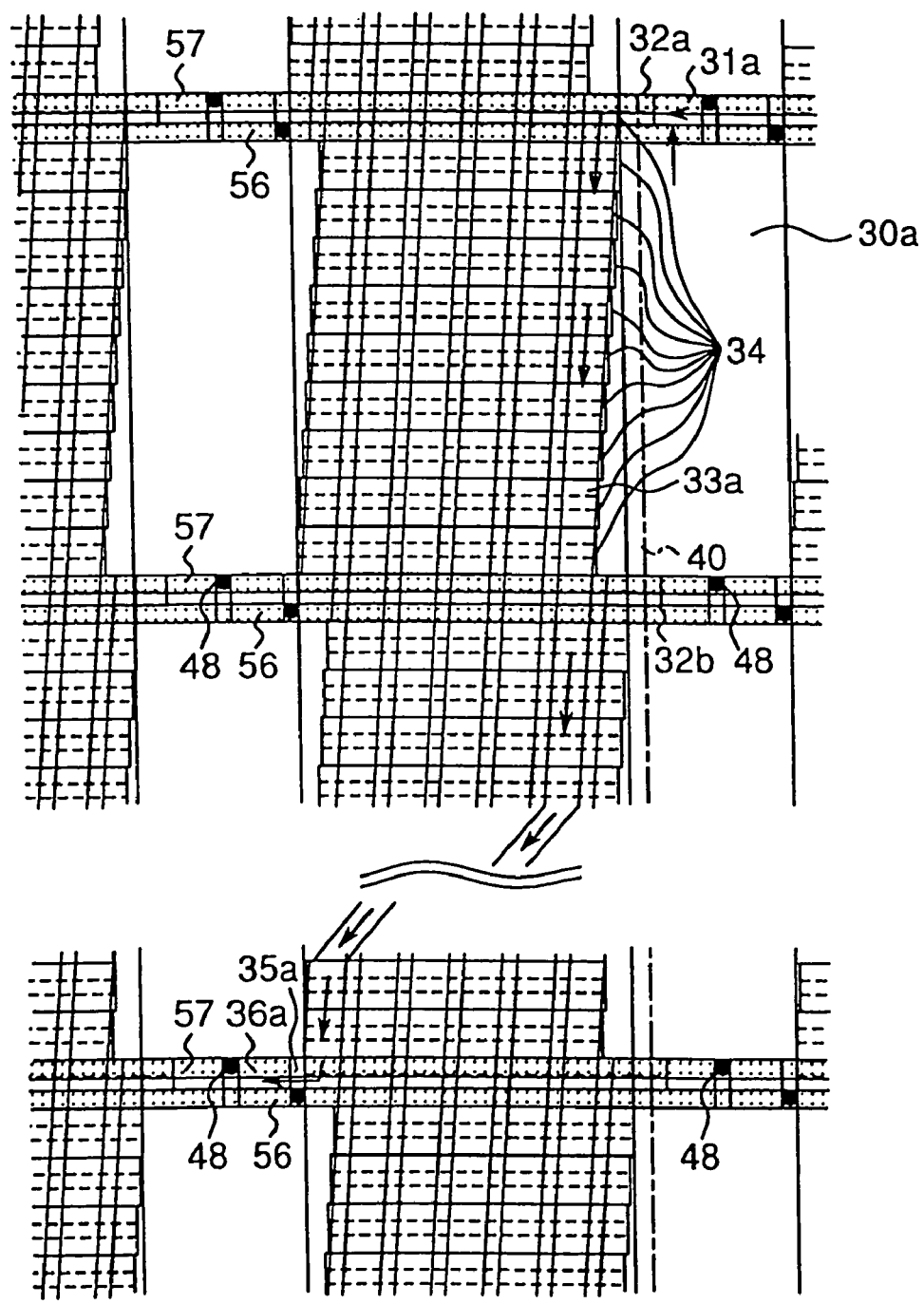
FIG. 4 is a partial schematic front view showing a layout of metal wires for controlling read-out operations in the high-speed image sensor according to the first embodiment.
Figure 5:
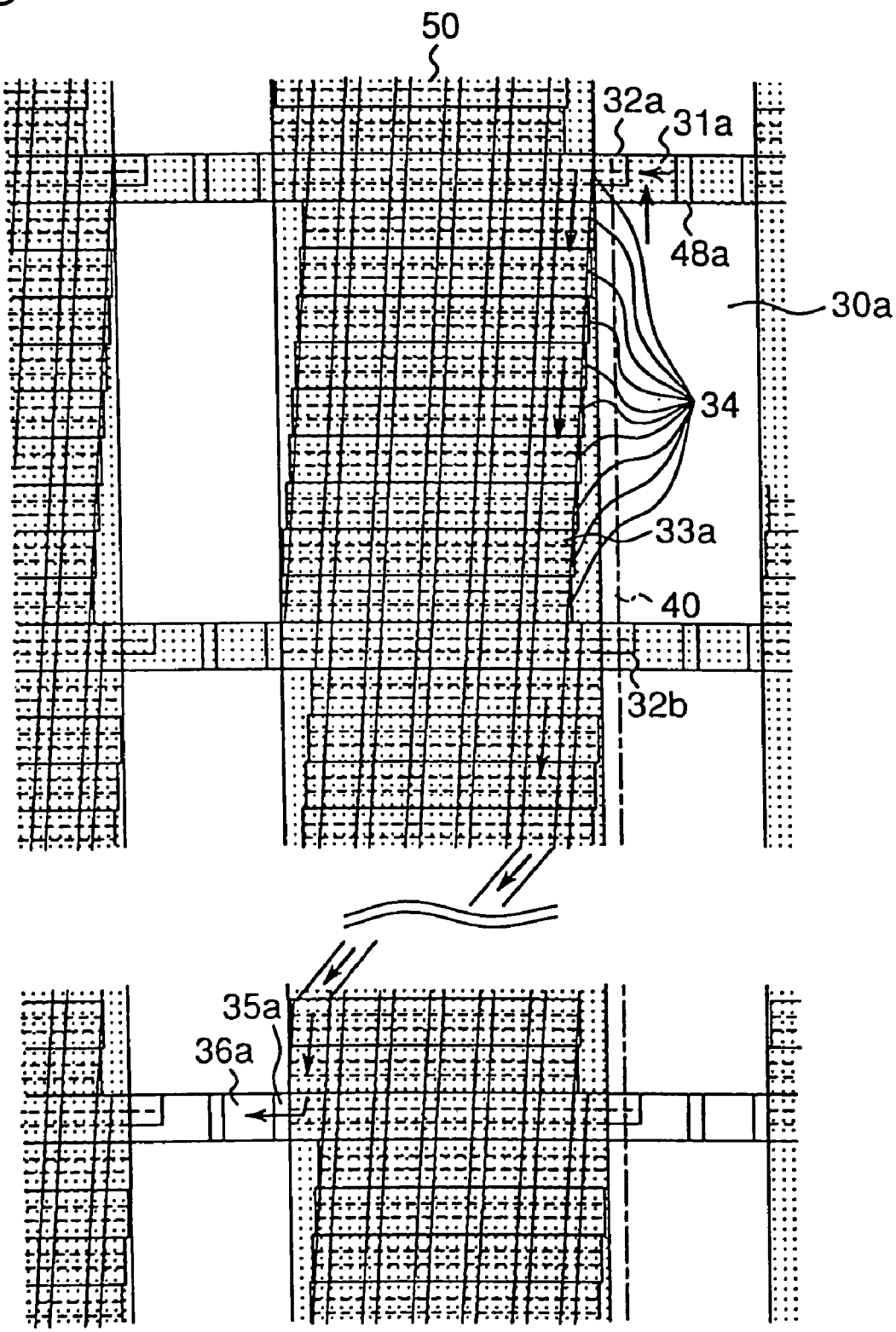
FIG. 5 is a partial schematic front view showing a light blocking layer in the high-speed image sensor according to the first embodiment.

FIG. 1 shows schematically a light receptive area of a high-speed image sensor and FIG. 2 shows an array of CCD transfer path 33 elements and polysilicon electrodes 51a to 51c. Further, FIGS. 3 through 5 each show a plane superposed on FIG. 2. Of these figures, FIG. 3 shows a first (underlying layer) metal wire layout plane. FIG. 4 shows a second (upper layer) metal wire layout plane. FIG. 5 shows the top plane which constitutes a light blocking surface 50 for preventing a light from entering to anything other than photodiodes. For easier understanding, the first metal layer shown in FIG. 3 is shown as superposed on the layer of FIG. 2. The second metal layer of FIG. 4 is also shown as superposed on the layer of FIG. 2. For simplification, however, the intermediate first metal layer is not shown in FIG. 4. Similarly, FIG. 5 shows only the top plane over the layer of FIG. 2. Thus, the high-speed-image sensor according to the present embodiment is provided with the two metal layers except the light blocking layer 50 shown in FIG. 5, so that three-dimensional intersection of the wirings is possible, thus arbitrarily configuring circuits regardless of the outside and the inside of the light receptive area.

First, operations of continuous overwrite image sensing are described with reference to FIG. 1.

Image information (charges) generated at a photodiode 30a, which constitutes a signal converting means, are collected at a charge collecting well 31a and then transferred from an input gate 32a to a CCD transfer path 33a which constitutes an electric-signal recording means. In the CCD transfer Path 33a, the charges are transferred downwardly in the figures. This transfer of charges in the CCE transfer Path 33a is executed by a standard three-phase driving.

The CCD transfer path 33a is not parallel to a perpendicular 40 connecting the input gate 32a and an input gate 32b included in a pixel in the figure with respect to a pixel including the photodiode 30a but inclined leftward with respect to the perpendicular 40 in the figure. With this inclination, a CCD transfer path 33b extending from the input gate 32b of the lower side pixel can be incorporated into the light receptive area.

The CCD transfer path 33a extends straightly and obliquely downward as long as six pixels until its bottom end, where it has a drain gate 35a and a drain 36a. The image information, after being transferred in the CCD transfer path 33a, is discharged out of the image sensor through the drain 36a. As described later, the drain gate 35a acts also as a read-out gate. It should be noted that the drain gate 35 is supplied with an operating voltage from a metal wire 56 shown in FIG. 4.

As shown in FIG. 2, the CCD transfer path 33a has ten CCD elements 34 for each pixel, so that six pixels correspond to 60 CCD elements. Accordingly, the CCD transfer path 33a always holds 60 image frames of the most recent image information therein. In science and technological applications, the minimum required number of continuous image frames necessary for reproduction of motion images is 50 (<60). Thus, the motion images can be reproduced for 10 seconds at five frames/sec. in lack of smoothness.

The inclination of the CCD transfer path 33a with respect to the perpendicular 40 connecting the input gates 32a and 32b is set in such a way that each time it advances downward by one pixel, it shifts by one pitch of the transfer path, i.e. sum of the width of the one CCD transfer path 33 and that of one channel stop separating two CCD transfer paths 33.

As mentioned above, one pixel length accommodates 10 CCD pixels. In addition, both the vertical length of each CCD pixel and the pitch of the transfer path are 4.8 microns in the present embodiment. Therefore, each time the transfer path advances by one pixel (which corresponds to 10 CCD elements in distance), it shifts leftward by one transfer pitch as described above. The inclination is 1/10 and, in terms of angle, arctangent 5.71 degrees. It should be noted that the breakdown of the transfer path pitch consists of 3.2 microns of the width of the CCD transfer path 33a and 1.6 microns of the width of the channel stop. Due the inclination set as above, when each time the CCD transfer path 33a advances downward by one pixel, it shifts leftward by 4.8 microns, so that at the left of the input gate 32b of the lower side pixel a space is formed, which justly accommodates one CCD transfer path 33 and one channel stop.

In such a hypothetical configuration that the CCD transfer path 33a connected to the upper side photodiode 30a extends perpendicularly, in order to provide a new CCD transfer path 33 connecting the lower side photodiode 30b, the lower side photodiode 30b and the input gate 32b are shifted rightward by one pitch of the CCD transfer path. In this case, centerlines of the two right and left CCD transfer paths connected to the upper side and lower side photodiodes 30a and 30b both extend perpendicularly. On the other hand, a line connecting the input gates 32a and 32b is inclined rightward by 1/10, so that the centerlines of the CCD transfer paths 33 are not parallel to the line connecting the input gates 32a and 32b. Although, such a hypothetical configuration is in principle the same as the present embodiment, the present embodiment is superior to the hypothetical configuration because of its square pixel array.

Also, in such a hypothetical configuration that the perpendicular CCD transfer path 33a connected to the upper side photodiode 30a is terminated at the lower end of upper side photodiode 31a or that of an upper side pixel including it, the CCD transfer path 33b connected to the lower side photodiode 31b can be extended perpendicularly. In this case, however, the CCD transfer path 33 accommodates only 10 CCD elements with the number of continuous image frames being 10, so that it cannot be a video camera because it cannot reproduce motion images.

In addition, supposing that image information generated at the lower side photodiode 30b would be transferred to the lowering CCD transfer path 33a, image information from the upper side and lower side pixels is mixed, so that images cannot be reproduced.

It is possible to permit the center line of the CCD transfer path 33a and the line connecting the input gates 32a and 32b to extend in parallel to each other upward and downward directions respectively in the figure. In this case, the CCD transfer path 33b corresponding to the lower side pixel is provided on the left side of the lowering CCD transfer path 33a and charges from the lower side photodiode 30b are sent across the CCD transfer path 33a. This connection is not capable of complete transfer of charge if it is given by any principle other than the CCD principle, e.g. simple metal wires. For straddling with the CCD principle, in the element to be straddled, the charges should be alternately transferred in two directions like in the case of the above-mentioned image sensor shown in FIG. 23. Namely, the image information is transferred horizontally for straddling, and vertically for sending downward. With the present level of technology it is difficult to alternately transfer the information in two directions at a high speed.

Thus, in the high-speed image sensor according to the present invention, the CCD transfer path 33 is inclined with respect to the line connecting the upper and lower input gates 32a and 32b, it achieving a construction in which photodiodes 30 are arranged in a square pixel array and the CCD transfer path 33 is connected to each photodiode 30.

The pixels each have a vertical size of 48 microns (= 4.8 microns×10 elements) and the CCD transfer path 33 has a width of a length of seven CCD transfer paths plus a length of six channel stops, i.e. 32.0 microns (=3.2×7+1.6×6). Therefore, the photodiode 30 has a width of 16.0 microns (=48−32.0). The pixels number 256×256 and each side of the light receptive area measures 12.288 mm. The chip size is 15 mm×15 mm. Both the chip and the camera can be manufactured and fabricated respectively using a standard optical system.

The charge collecting well, the drain, the input gate, the drain gate, etc. are provided at the upper region of the photodiode. The length of this region is six microns. Therefore, the numerical aperture, a value of a photodiode's area divided by a pixel area, is 29.2% (=16.0×(48−6)/(48×48)). It should be noted that the effective numerical aperture could be enhanced by mounting an on-chip micro-lens.

When a desired phenomenon to be image sensed occurs, the continuous overwriting operation is stopped so that image information held in the CCE transfer path 33 is then read out. The means for this read-out operation will be described below.

In a state where the CCD transfer path 33 has stopped its transfer operations, one pixel (e.g., a pixel including the photodiode 30$a$) is selected of all the pixels and the drain gate 35$a$ at the lower end of the CCD transfer path 33$a$ is opened, to perform only one step of the transfer operation by the CCD transfer path 33. By this transfer operation, the first piece of the image information of the 60 pieces of the image information generated at the photodiode 30$a$ is discharged from the drain gate 35$a$ to the drain 36$a$ and then to one of horizontal branched lines 58$a$ of a drain 58 (see FIGS. 3 and 6). All drain lines 58 are connected to one line, thus being all connected to a read-out circuit outside the light receptive area in read-out operations. Through this read-out circuit, the image information is read out of the image sensor. Namely, the read-out line for the light receptive area and the drain line are shared in use. In addition, the drain gate also acts as the read-out gate.

Figure 6:
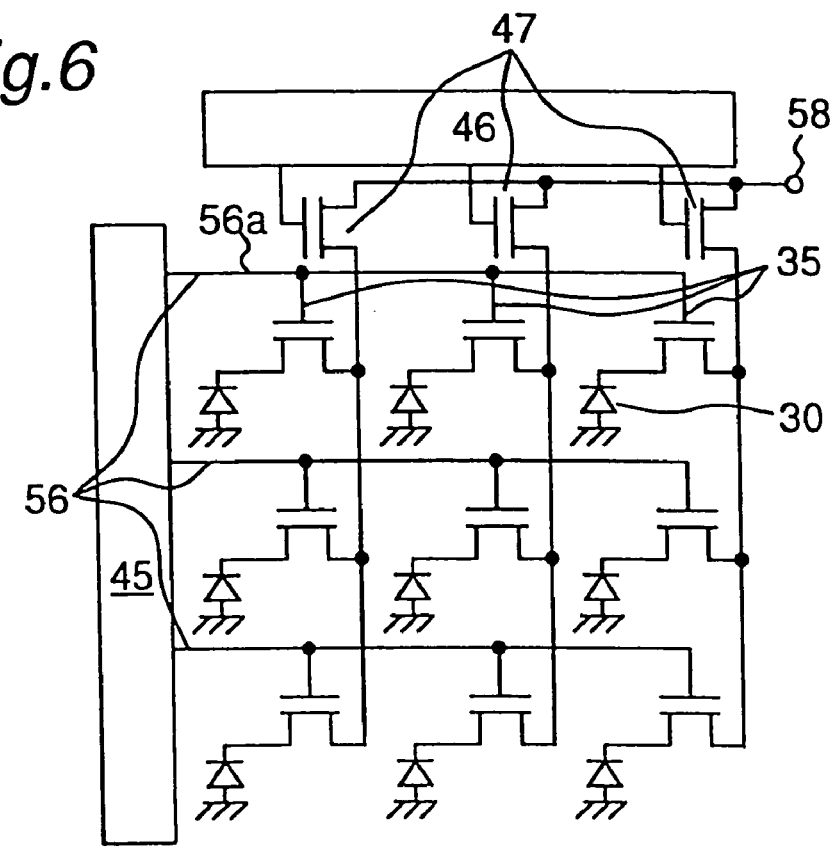
FIG. 6 is a circuit diagram showing a MOS type read-out circuit.

To open the gates one by one by sequentially selecting one pixel as mentioned above, such a MOS type circuit as shown in FIG. 6 is used. An electrical signal (charge) consisting of image information is held at the lowest element of each CCD transfer path. The drain gate 35 acting also as the read-out gate is constituted by a vertical MOS switch (gate) as shown in FIG. 6. When a voltage is fed from a vertical-scanning shift register 45 to one horizontal control line 56$a$ of horizontal control lines 56, a horizontal series of MOS gates (drain gates) 35 connected with this horizontal control line 56$a$ are opened simultaneously to be conductive. In this conductive state, a voltage is sequentially sent from the horizontal-scanning shift register 46 to horizontal MOS gates 47 arranged outside the light receptive area. Through a photodiode 30, which corresponds to a intersection of a vertical signal-read out line connected to the horizontal MOS gate 47 to which the voltage is supplied and the horizontal control line 56$a$ to which the voltage is fed (the 60th image information storage element in the FIGS. 1 and 2, i.e. the lowest element of the CCD transfer path 33), the image signal flows out to the drain line 58. Then, the voltage is sequentially sent from the vertical-scanning shift register 45 to the horizontal control lines 56, while scanning a horizontal-scanning shift register 46. Thus, the image information of all pixels corresponding to a given point in time is sequentially read out.

In the present embodiment, a defect on the CCD transfer path 33 has an influence only on a pixel including one photodiode 30, the image information of which is recorded by such a CCD transfer path 33, resulting in a dot-shaped defect on a reproduced image. This dot-shaped defect can be corrected, thus largely improving the manufacturing yield.

The following will describe a means for performing intermittent monitoring in the setting of the image sensing conditions.

Between the drain 36 and the charge collecting well 31 is provided an overflow gate 48, which is supplied with an operating voltage from the metal wire 57 shown in FIG. 4.

If excess charge is generated due to a strong incident light during image sensing, the excessive charges are discharged via the overflow gate 48 to the drain 36 for preventing occurrence of blooming. During read-out operations, the overflow gate 48 is completely closed. The overflow gate 48 also acts as a reset gate.

When setting the image sensing conditions, the overflow gate 48 is used as a read-out MOS gate. This enables direct reading out of image information, without passing through the CCD transfer path 33. During this direct read-out, the drain gate 35 is closed. For example, if an overflow gate 48$a$ of the photodiode 30$a$ is opened in FIG. 2, charges collected in the charge collecting well 31$a$ are moved to the rightward drain 36 and read out of the light receptive area.

Illumination at the time of setting the image sensing conditions is executed as a manner of intermittent illumination. To prevent occurrence of charge due to incidence of a light during read-out, the mechanical shutter is closed during read-out. The mechanical shutter is also closed when information is read out after image sensing.

The read-out circuit is not limited to the above-mentioned MOS circuit. It may be of a CMOS type. A CMOS circuit is an improved MOS circuit to reduce required power. Since high-speed image sensing requires large power for illumination, it is impossible with a battery power supply. Therefore, the present invention may be of a MOS type.

An amplification circuit may be provided at a stage preceding the read-out line. Also, a CMD etc. may be incorporated which enables converting a charge quantity into a voltage to perform repetitive read-out without destroying image information. A low-noise TSL-MOS type circuit may be used. With these approaches, random noise peculiar to read-out by use of the read-out line can be reduced, thus enjoying the advantage of low-noise transfer by use of the CCD transfer path.

As shown in FIG. 2, three polysilicon electrodes 51$a$, 51$b$ and 51$c$ vertically arranged are provided on each of CCD elements 34. The horizontal length of these polysilicon electrodes is 30.6 microns, equal to the width of the transfer path region (vertically long surface between right and left photodiodes). The width of these polysilicon electrodes is 1.6 microns. The total pitch is 4.8 microns for these three electrodes.

Figure 7A:
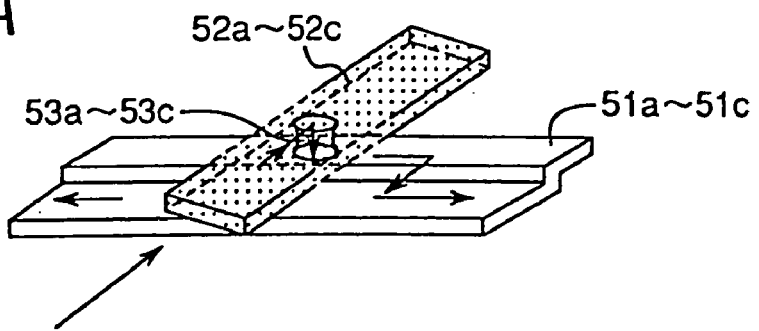
FIG. 7A is a perspective view showing a contact point.
Figure 7B:
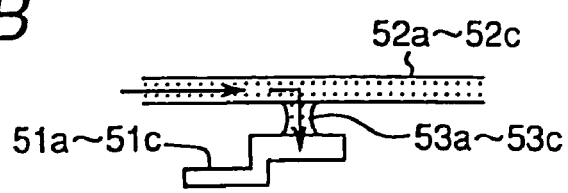
FIG. 7B is a side view showing the contact point.

In order to transfer charges in the CCD transfer path 33, it is necessary to give a voltage for driving the polysilicon electrodes 51$a$ through 51$c$. Reference numerals 52$a$ through 52$c$ in FIG. 3 each indicate an aluminum wire for feeding the voltage. These aluminum wires 52$a$ through 52$c$ constitute a set. Each of these aluminum wires 52$a$ through 52$c$ feeds first-phase, second phase, and third-phase driving voltage. Reference numerals 53$a$, 53$b$, and 53$c$ in FIG. 3 indicate contact points. FIGS. 7A and 7B show a transfer path from one of the aluminum wires 52$a$ through 52$c$ via the contact points 53$a$ through 53$c$ to the polysilicon electrodes 51$a$ through 51$c$. The contact points 53$a$ through 53$c$ are to be provided in the channel stopper, so that the width of the channel stopper is set little wider (1.6 microns as mentioned above, double the design rule value of 0.8 microns).

Figure 8:
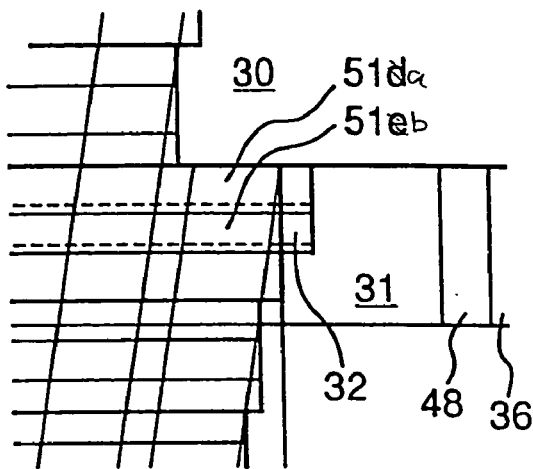
FIG. 8 is a partial enlarged view showing an input gate in the image sensor according to the first embodiment.

FIG. 8 is an enlarged view of an input gate 32. At the input gate 32, the first-phase and second-phase polysilicon electrodes 51$a$ and 51$b$ extend to the charge collecting well 31, so that when they are supplied with a driving voltage, a potential barrier between the charge collecting well 31 and the CCD transfer path 33 is lowered, thus transferring charges into the CCD transfer path 33.

Second Embodiment

Figure 9:
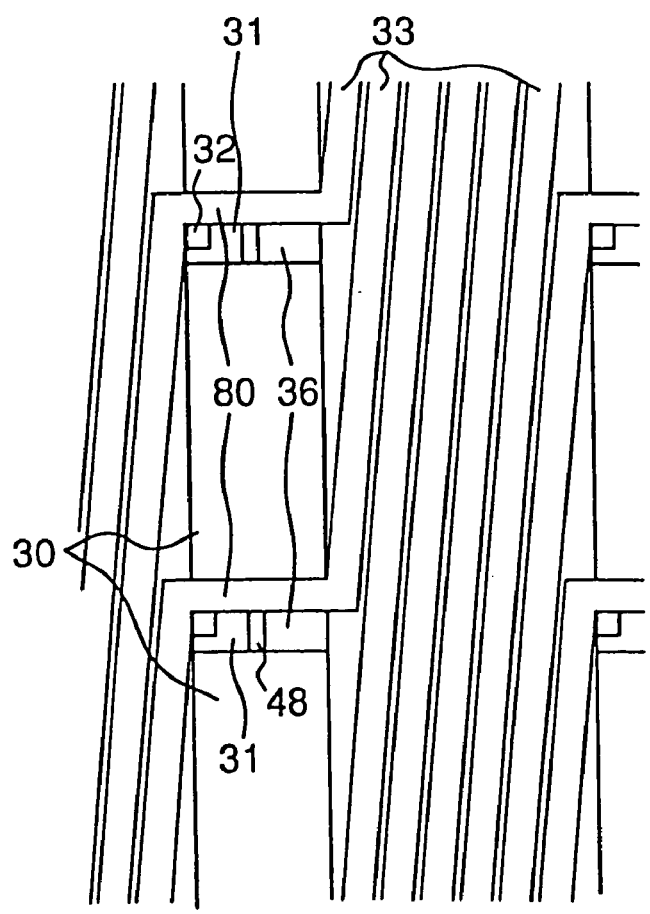
FIG. 9 is a partial schematic front view showing a layout of pixels and CCDs in the second embodiment.

FIG. 9 shows a second embodiment of the present invention. It differs from the first embodiment in a respect that in place of the MOS switch type read-out circuit, a horizontal CCD transfer path 80 is provided between the photodiodes. The drain 36 is used for continuous overwriting, blooming control, etc.

As mentioned above, it is difficult to prevent incomplete transfer due to a rapid change in the transfer direction during the ultrahigh-speed image sensing. Therefore, if charges are transferred from the above downward obliquely on the CCD transfer path 33 and bent at an acute angle and then to the horizontal CCD transfer path 80, the image information stored at an element of the horizontal CCD transfer path 80 is deteriorated. This image information, however, corresponds to beginning few frames of an image, so that the image information corresponding to 60 frames except the beginning few frames is stored on the CCD transfer path 33.

The layout of the charge collecting well 31 and the overflow gate 36 acting also as the reset gate is the same as that in the first embodiment. The layout of the electrodes, the metal wires, etc. is also the same as that in the first embodiment. The driving voltage for the horizontal CCD transfer path 80 may be fed by either a thin metal wire passing just below the photodiode 30 or a transparent polysilicon wire. After image sensing, on the other hand, read-out can be performed at a lower speed, thus enabling almost the complete charge transfer even perpendicularly. Also, the transfer direction does not change alternately but is fixed at a constant direction, so that the design of the electrodes does not become so complicated.

In the high-speed image sensor according to the present embodiment, CCDs is used to completely transfer image information to the outside of the light receptive area, thus obtaining a high-quality image. Also, the construction can be simpler because no read-out lines are necessary, thus improving the image quality.

Third Embodiment

Figure 10:
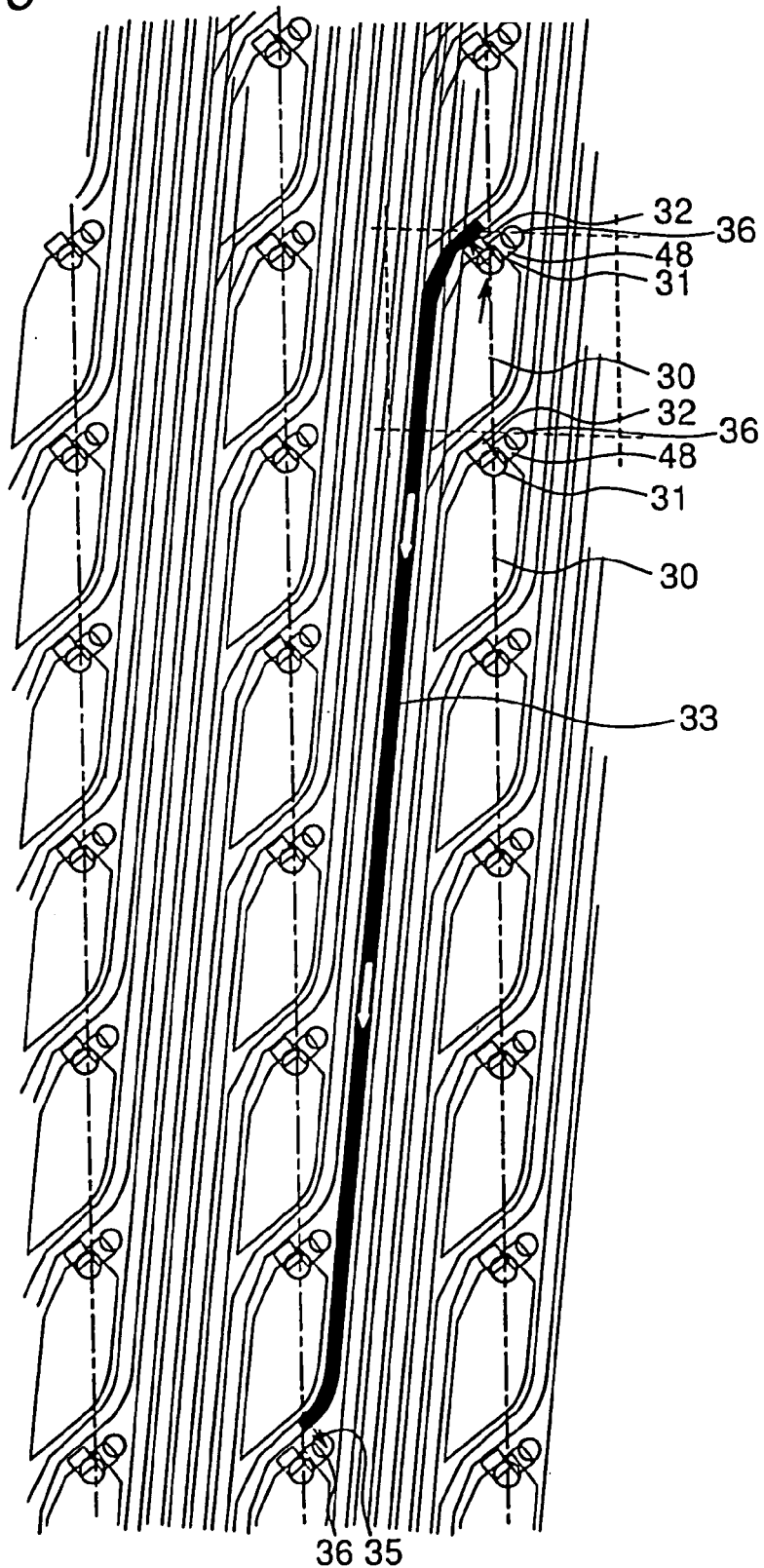
FIG. 10 is a partial schematic front view showing a layout of pixels and CCDs in a third embodiment.

FIG. 10 shows a pixel layout in a high-speed image sensor according to a third embodiment of the present invention. As can be seen from FIG. 10, the present embodiment can be obtained by changing the layout of the pixels of the image sensor provided with the CCD transfer path having a moderate curve shown in FIGS. 24 and 25 into a square layout. Also, it can be obtained by changing the acute-angle corner in the second embodiment shown in FIG. 9 into a moderate-curve corner.

Figure 11:
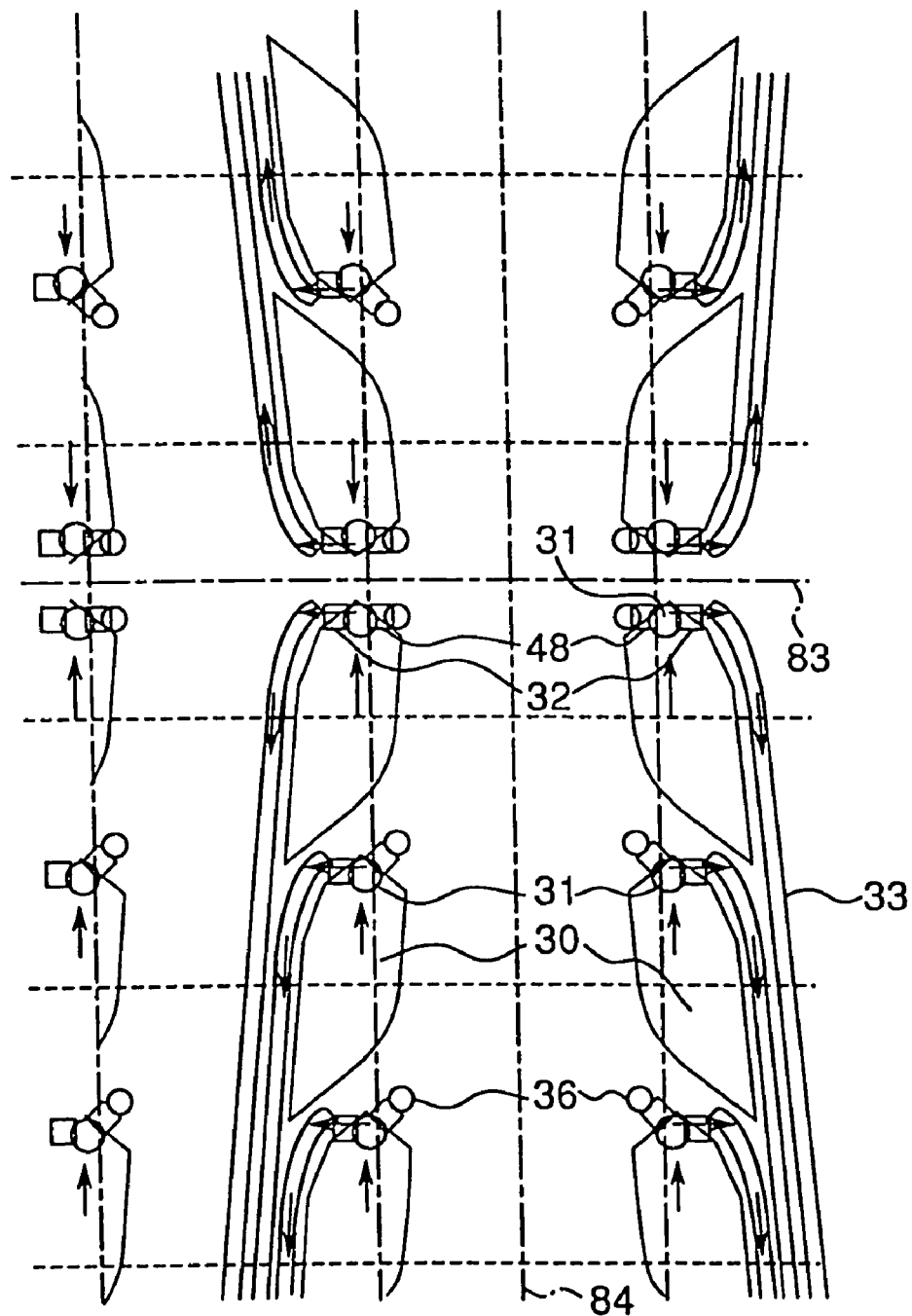
FIG. 11 is a layout of pixels and CCDs at a center portion in the third embodiment.
Figure 12A:
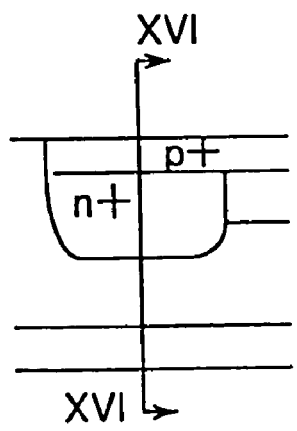
FIG. 12A is a partial side view showing a photodiode having a gate region crossing the center of the photodiode.
Figure 12B:
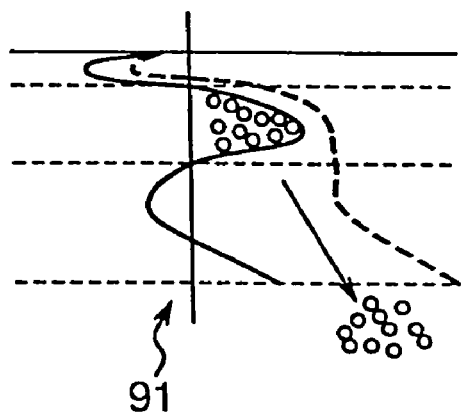
FIG. 12B is a cross-sectional view taken along line XVI—XVI of FIG. 12A.
Figure 12C:
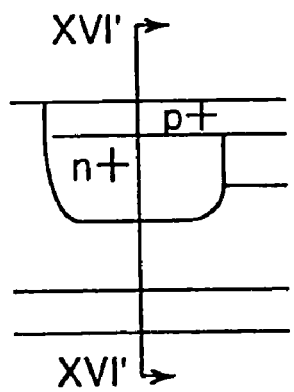
FIG. 12C is a partial side view showing the photodiode having a gate region crossing the center of the photodiode.
Figure 12D:
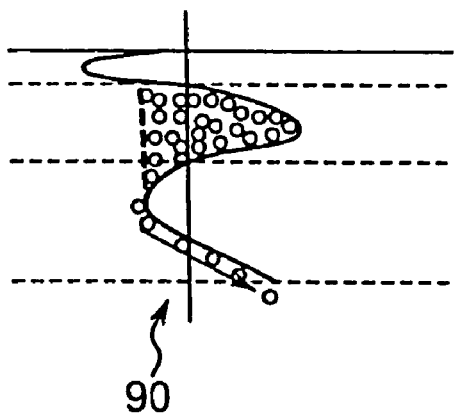
FIG. 12D is a cross-sectional view taken along line XVI'—XVI' of FIG. 12C.

The four image sensors obtained by inverting and rotating the image sensors shown in FIG. 10 can be butted along vertical and horizontal center lines 83 and 84 as shown in FIG. 11. Such a construction makes it possible, in addition to the advantage of the above-mentioned square layout of the pixels, to cut and butt the image sensor into ¼ with the center lines 83 and 84 as mentioned later. It should be noted that the CCD element pitch is 4.8×4.8 microns and the number of pixels is 256×256.

So a CCD type image sensor with a CCD transfer path having an oblique or curved portion in the light receptive area has not been mentioned. In particular, a CCD type transfer path having its repetitive moderate curve in the light receptive area is not known to those skilled in the art. The present embodiment, however, even as compared to the first and second embodiments, is of the simplest and lenient construction having neither unnecessary circuits nor acute changes in direction.

In a typical CCD type image sensor, light receptive area has electrodes arranged from one end to the other. Also in the case of the parallel CCD type sensor by Kosonocky et al. shown in FIG. 23, electrodes and gates are provided from one end to the other. On the other hand, in the present embodiment, one of the four sensors, before they are incorporated as shown in FIG. 11, has no electrodes incorporated at the upper and lower sides in FIG. 10. Those wires for feeding a control voltage from the outside of the light receptive area or for reading out information to the outside of it can be incorporated arbitrarily using two-layer metal wiring, so that they can be sent along both the lower and upper sides. Therefore, by combining the four sensors as shown in FIG. 11, there is produced an elongated region with neither electrode nor wires along the center lines 83 and 84. As for pixels facing the center lines 83 and 84, however, the position of the charge collecting well 31 and the drains is shifted a little. In a region along the center lines 83 and 84, as shown in FIG. 11, there is provided a sufficiently large space around the photodiode 30, such that layout changes can be done arbitrarily.

If a device shown in FIG. 11 has one or two defects therein, it can be cut along the two center lines 83 and 84 so that a ¼ defect-free portion can be taken out. Also, thus taken out ¼-sized defect-free portions can be butted to provide a larger sensor. By providing such a cuttable/buttable layout, the yield can be drastically improved. If, for example, a device in a ¼-sized screen has a yield of 10%, on a double-sized screen it is 1%, and on its original size screen it is squared to 0.01%, so that only one of 10,000 devices can be used. Against this, by butting and using devices on a ¼-sized screen, the yield with the original size is 10%.

Figure 24:
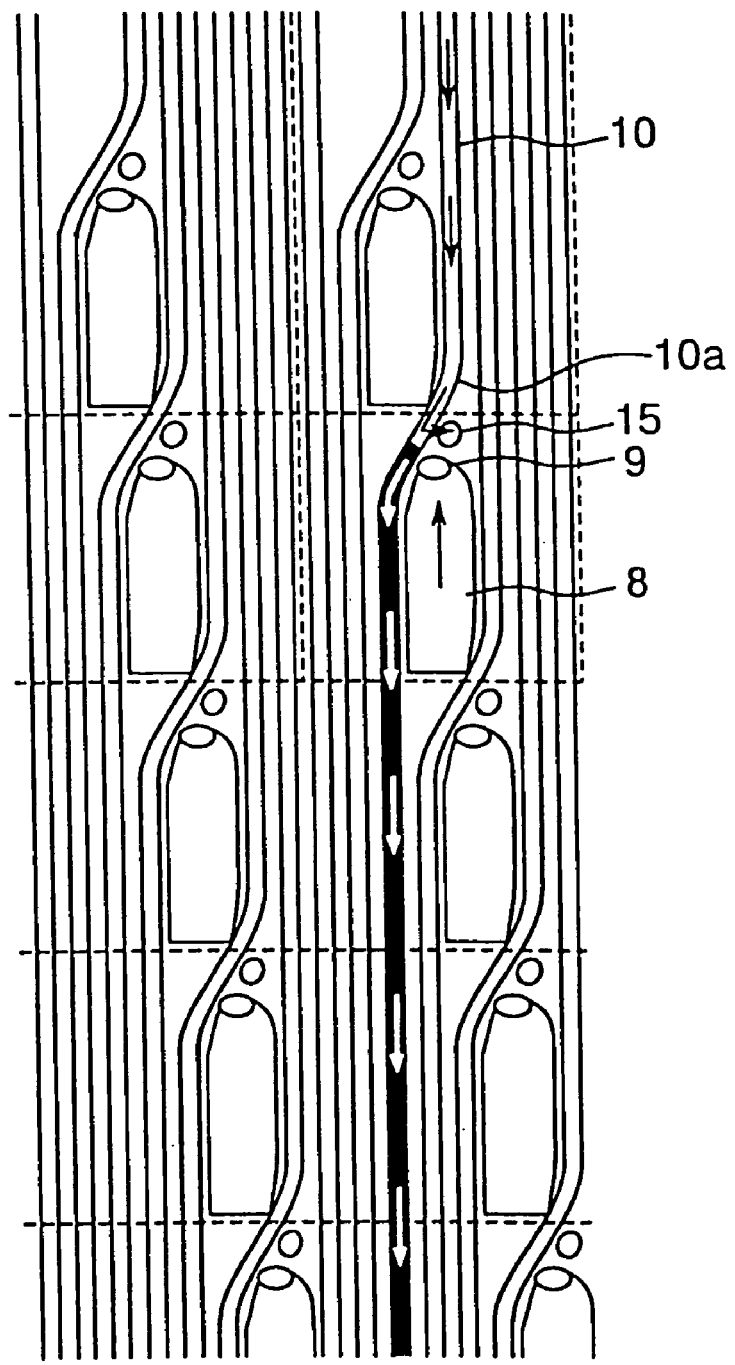
FIG. 24 is a partial schematic front view showing another example of a conventional high-speed image sensor.
Figure 25A:
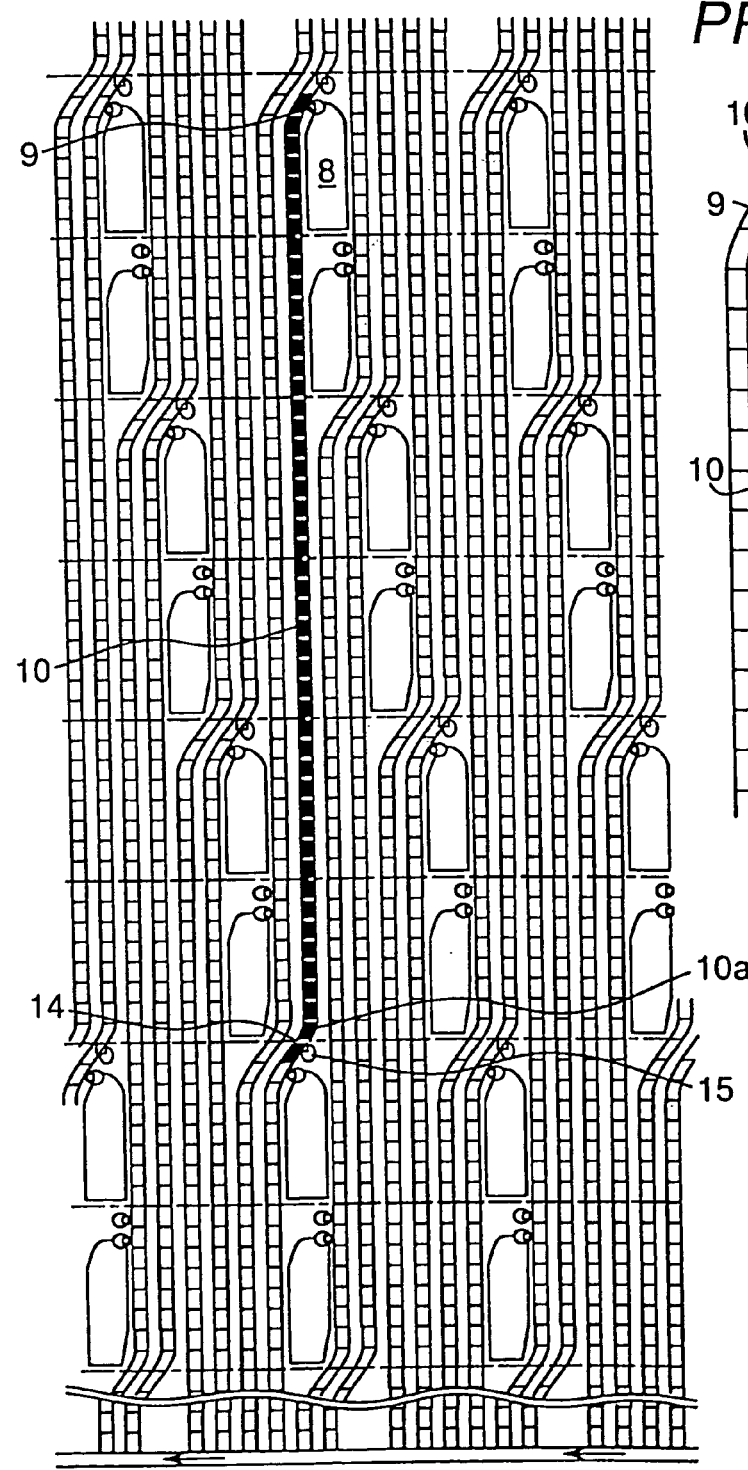
FIG. 25A is a partial schematic view of the high-speed image sensor of FIG. 24.
Figure 25B:
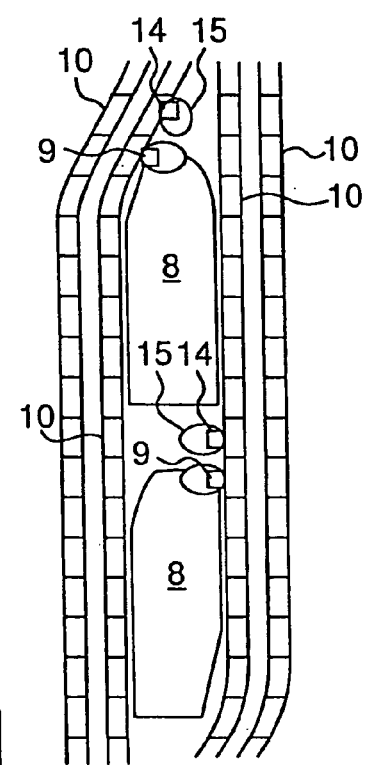
FIG. 25B is a partial enlarged view of FIG. 25A.

It should be noted that the image sensors shown in FIGS. 24, 25A, and 25B cannot be cut and butted. This is because the photodiode is shifted in position a little horizontally, so that a line connecting these photodiodes intersects with the centerline. On the other hand, the present embodiment employs a square layout of pixels, to be free of unevenness, thus enabling cutting and butting.

Also in the case of the first and second embodiments, by changing the layout a little and the shape of the photodiode 30 along the center line, such an elongated region along the center line can be created that can be cut. For example, by decreasing the vertical length of the photodiode 30 along the center line by about 10 microns and increasing its width to provide the same area as the other photodiodes 30, there is created a 20-micron long cuttable region along the center line. Near the center line the recording CCD transfer path 33 is rarely incorporated, thus providing a space enough for the photodiode 30 to be increased horizontally.

In the present embodiment, the pixel size is 48×48 microns, which is very large as compared to typical image sensors, thus facilitating alignment at the time of butting.

By butting the image sensor shown in FIG. 10, it is possible to make an image sensor having a 4 times area with 262,144 pixels (=512×512) without lowering the yield. By constructing a triple-plates type image sensing apparatus using this image sensor, there is provided a video camera capable of continuously image sensing of 60-frames at a image sensing speed of 1 million frames/sec. at a high resolution of about 800,000 pixels (accurately, 786, 432 pixels). By sequentially using three image sensors in this triple-plates type camera, it is possible to continuously capture 1,800,000 frames of images at a resolution of about 260,000 pixels. On the other hand, the cost of image sensor increases only linearly, e.g. 12 times of the cost in the case of 256×256 pixels;

Moreover, by utilizing the cuttable and buttable characteristics, it is possible to facilitate designing and manufacturing and also to increase the number of pixels. For example, in the case that the CCD element pitch is 7.2×7.2 microns and the number of pixels is 320×320, a ¼ sized image sensor has 160×160 pixels and a light receptive area size of 11.52 mm as each side (=7.2×10×160), providing a considerable margin.

In the present embodiment, although the intermittent monitoring means during image sensing condition setting is not incorporated in the image sensor, it may be done so like in the case of the first embodiment. Other gate operations and the layout of the electrode, metal wires are basically the same as those with the first and second embodiments.

In the first through third embodiments, although the charge collecting well 31 and the input gate 32 are disposed at the left top corner of the photodiode 30 and the drain gate 35 and the drain 36 are disposed at the right top corner of the photodiode 30, this disposition can be revered, i.e. right to left and upside down.

If the input gate 32 and the drain 35 are close to each other, the overflow gate 48 may be disposed between them. When disposing the perpendicular overflow gate 90-and-reset gate 91 such as shown in FIGS. 12A through 12D, on the other hand, the input gate and the drain may be distant from each other. In the first through third embodiments, for example, the input gate may be disposed to the left or right of the center of the photodiode.

Figure 13:
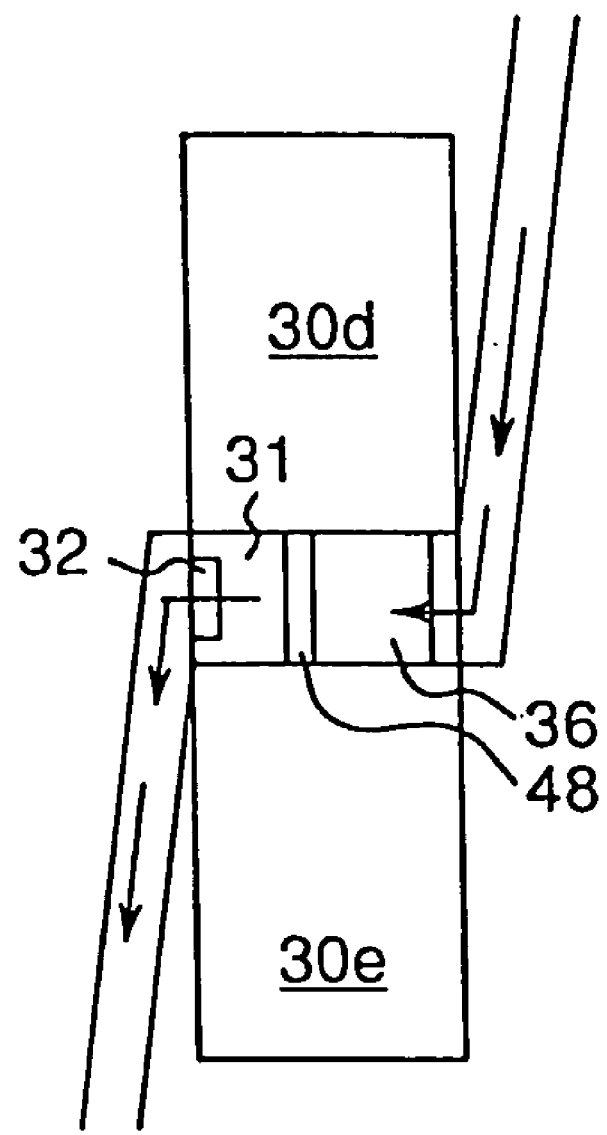
FIG. 13 is schematic view showing a vertical overflow/reset gate.

Additionally, in the first embodiment, as shown in FIG. 13, the charge collecting well 31, the input gate 32, the overflow gate 48, and the drain 36 may be disposed between the upper and lower photodiodes 30d and 30e obtained by dividing one photodiode. In this case, the distance over which charge is transferred in the photodiodes 30d and 30e is reduced to a half. It usually takes about one micro second for charges to move over a photodiode as long as a few tens of microns. If the length is halved, the transfer time is also halved, thus accelerating the transfer speed correspondingly.

Moreover, an amplifier is provided in the gate region at the center of the pixels and the read-out circuit is modified to some extent, a CMOS-APS type read-out approach is provided, thus largely improving the SN ratio.

To accelerate the transfer speed of charges in the photodiode, a potential gradient can be given in the photodiode in a direction toward the charge collecting well. In this case, the longer the photodiode is, the deeper would be the potential of the charge collecting well. To transfer charges from the charge collecting well to the CCD transfer path, the potential of the charge collecting well should preferably be shallow. In providing a potential gradient in the photodiode, if the photodiode is halved in length, the charge collecting well becomes shallow in depth.

Figure 14:
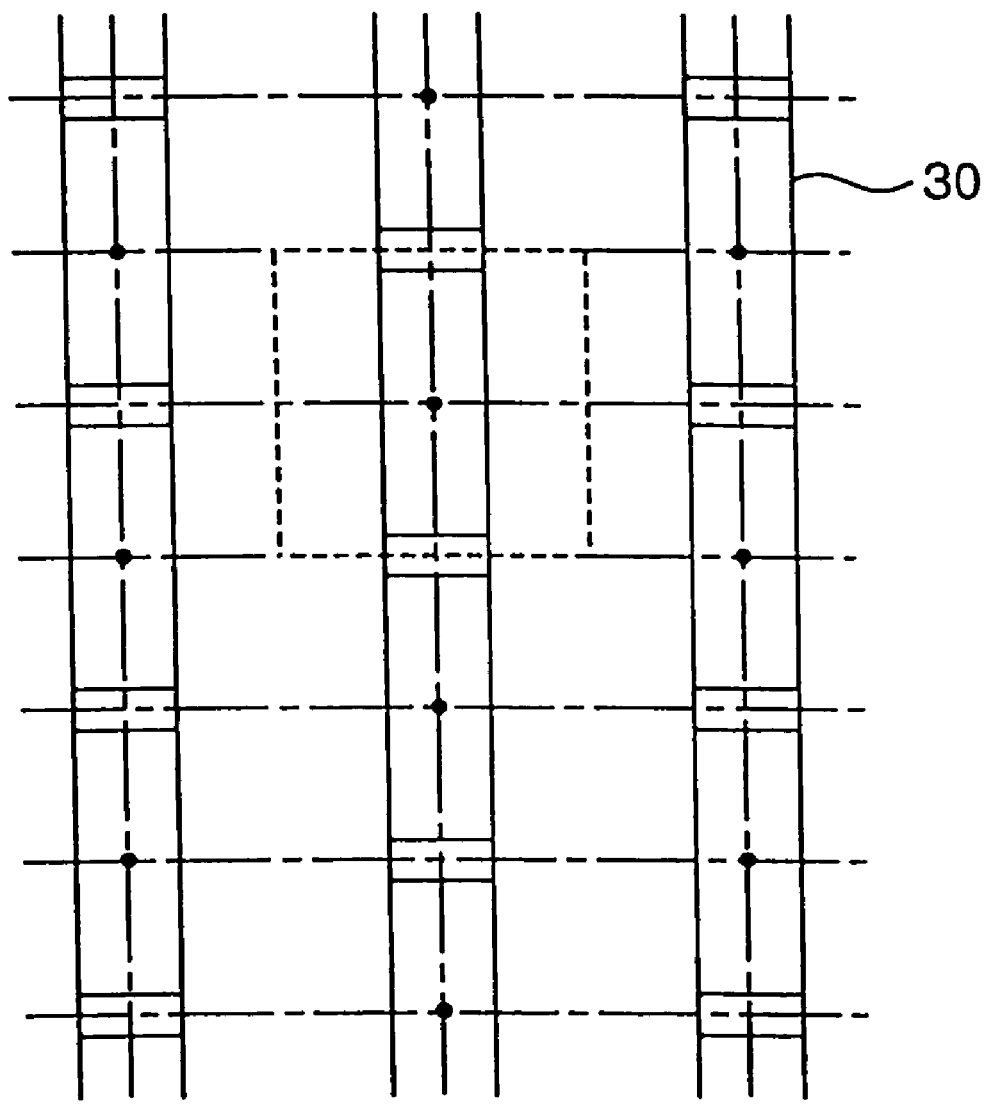
FIG. 14 is a partial schematic front view showing a zigzag pixel layout.

The pixel layout is not limited to a complete square one. As shown in FIG. 14, it may be a zigzag layout where the center of the photodiode 30 is located every other square or rectangular mesh.

The image sensor in the first through third embodiments may be of a stack type. The stack type is technologically difficult to manufacture, but can give a numerical aperture of nearly 100%. Further, the area occupation ratio of the recording section may also be nearly 100%. Also in this case, the CCD transfer path goes obliquely against a line connecting the input gates in the upper and lower pixels. In the case of this stack type, it is rather easy to mount, in place of the light receptive area, such a surface that made of a material which receives an electromagnetic wave or particle stream other than light and converts it into an electric signal. Such a layer may be provided that once converts an electromagnetic wave or particle stream other than lights into a light, e.g. a fluorescent surface which converts an X-ray into a light. By incorporating the image sensor having such surface into a transparent electron microscope, an ultrahigh-speed electron microscope can be obtained.

An intermittent monitoring feature for image sensing conditions setting may be incorporated into a video camera. For example, an incident light may be to enter another monitoring image sensor by using a mirror or prism. In this case, the relationship between the sensitivity and the incident light intensity needs to be matched with the conditions for continuous image sensing by use of a pixel peripheral recording type image sensor.

With an image sensing apparatus equipped with a high-speed image sensor according to any one of the first through third embodiments, a high-speed image sensing of one million frames/sec. is possible.

Fourth Embodiment

Figure 15:
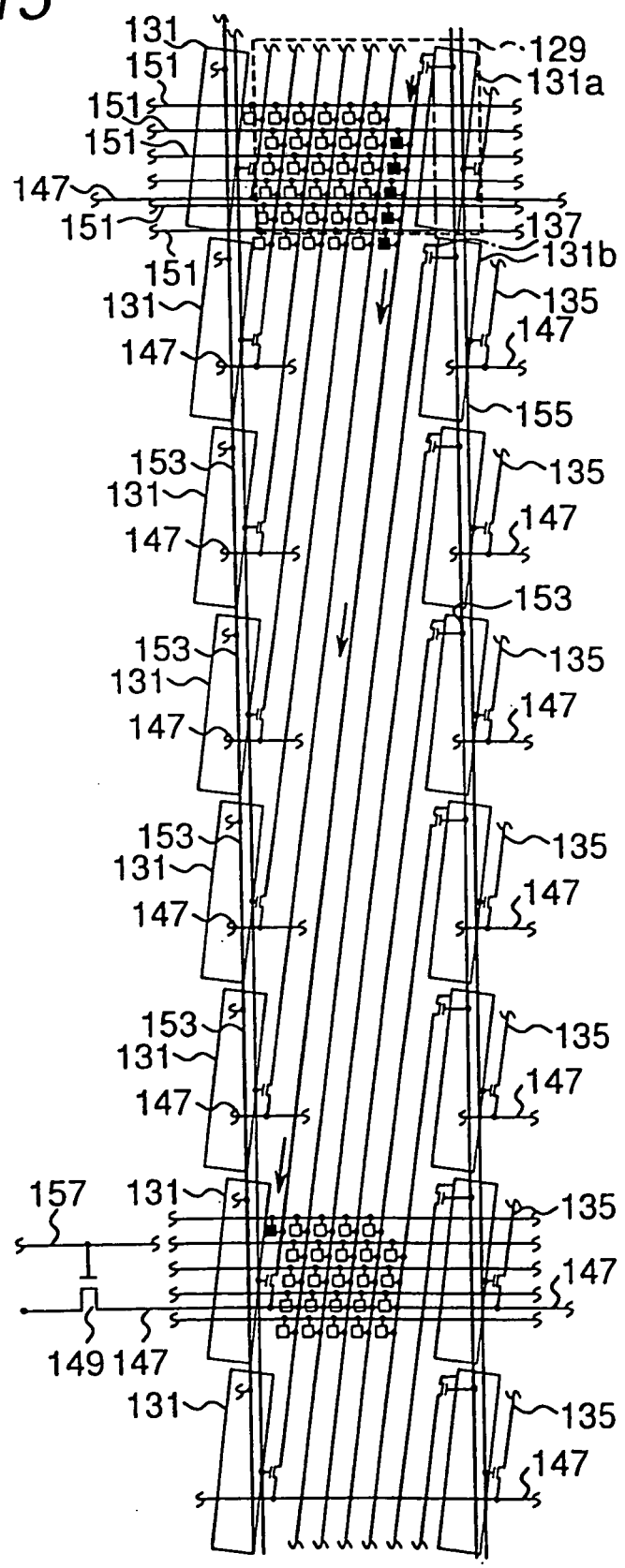
FIG. 15 is a schematic front view showing an image sensor according to the fourth embodiment.
Figure 16:
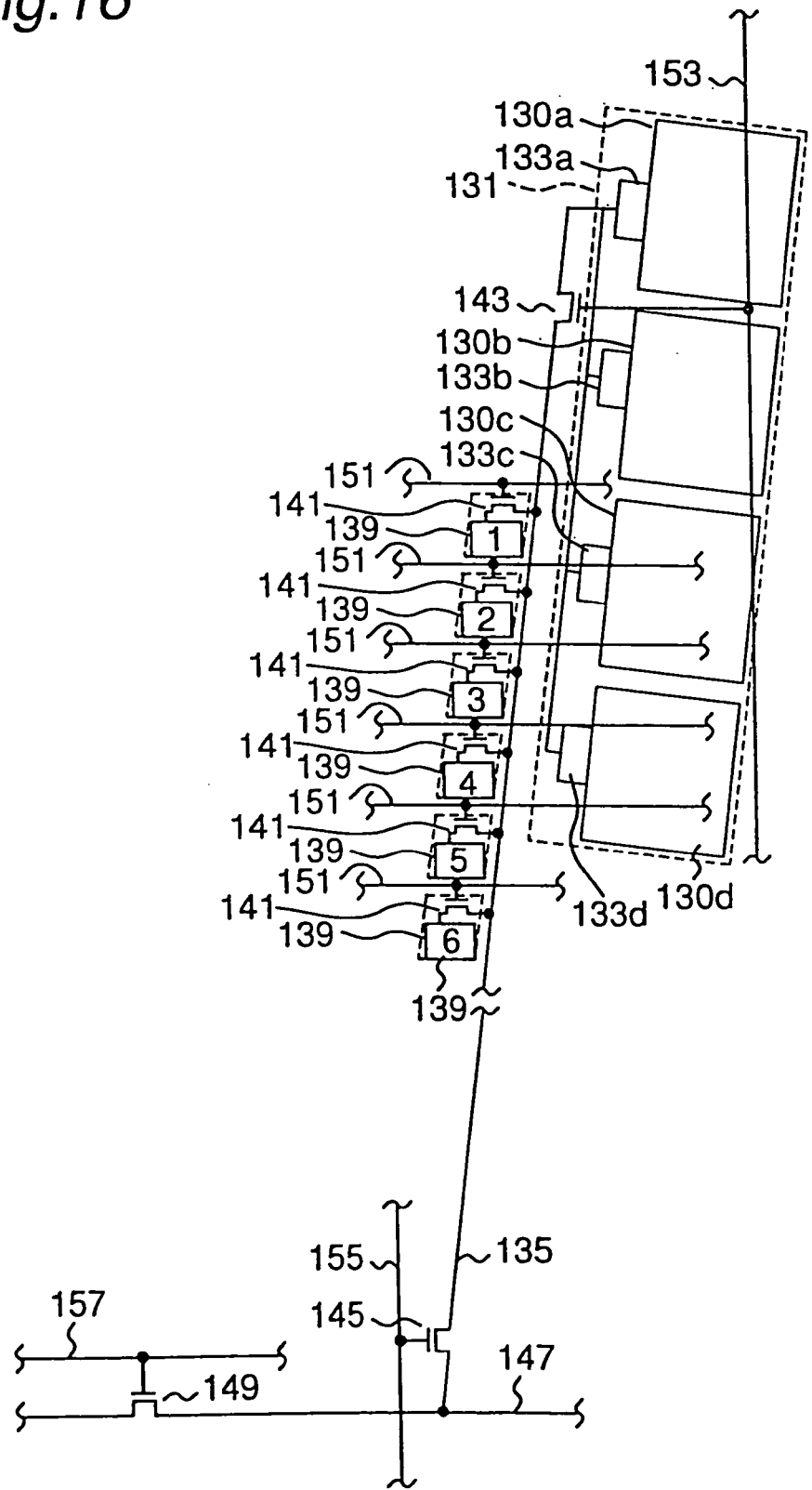
FIG. 16 is a partially enlarged schematic front view showing the image sensor according to the fourth embodiment.
Figure 17:
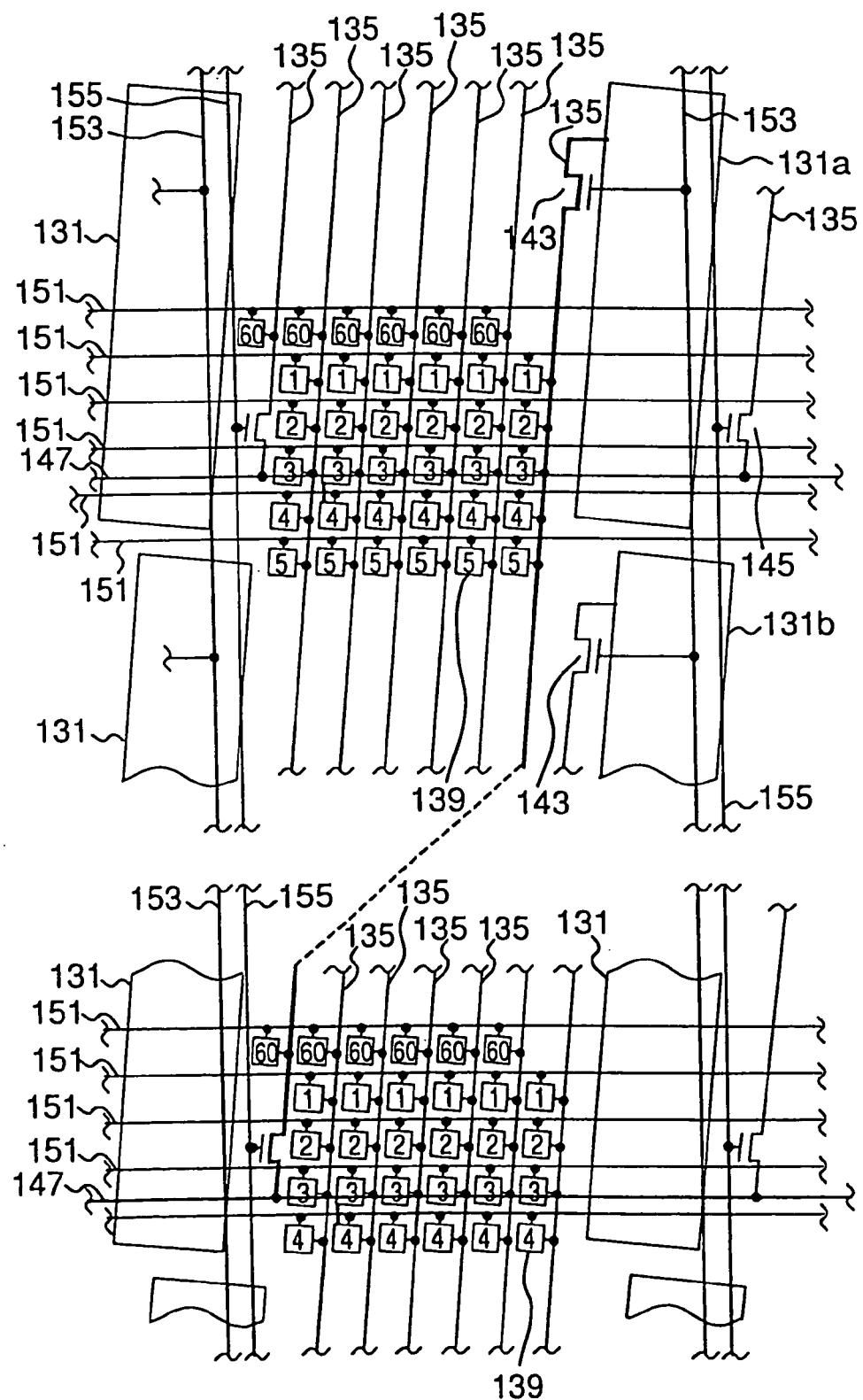
FIG. 17 is partial schematic front view showing the image sensor according to the fourth embodiment.

FIGS. 15 through 17 show a fourth embodiment of the present invention.

In this fourth embodiment, the electric signal recording means is a MOS type.

As shown in FIG. 15, each pixel 129 is provided with a photo-sensor 131 which acts as a signal converting means.

As shown in FIG. 16, each photo-sensor 131 consists of four photodiodes 130a, 130b, 130c, and 130d which are arrayed vertically and insulated form each other by a channel stop. Each of these photodiodes 130a through 130d is connected to the upper side of a vertical signal line 135 in the figure via amplifiers 133a, 133b, 133c, and 133d respectively.

If one photo-sensor 131 is comprised of thus divided multiple photodiodes 130a through 130d, even when each of the photodiodes 130a through 130d is provided with a potential gradient, a potential difference with respect to the vertical signal line 135 (electric-signal recording means side) does not become excessive, so that an electric signals generated at the photodiodes 130a through 130d can surely be sent to the vertical signal line 135. Also, since the photodiodes 130a through 130d each may be of a small area, a quality-time-proven photodiode currently available measuring a few microns or more than 10 microns in side can be used.

If the amplifier 133a through 133d each consist of a transistor, the larger a size in a direction intersecting with a charge flowing direction (width), the better the amplification efficiency; however, if the width is too large with respect to the size of the current flowing direction (length), it is difficult to maintain uniformity of the width-directional potential. However, by dividing the photo-sensor 131 into a plurality of portions as in the present embodiment, although the amplifiers 133a through 133d each has a smaller width, a total of the widths of these multiple amplifiers 133a through 133d becomes large and the amplifiers 133a through 133d each do not have a too large width as compared to its width, thus maintaining the width-directional potential uniformity. With-such a configuration, therefore, the amplification means can have an improved amplification efficiency and a larger allowable charge quantity.

As shown in FIG. 15, the vertical signal line 135 straightly extends obliquely downward as much as six pixels 129 in the figure. In other wards, the vertical signal line 135 is inclined against a line 137 connecting a position where one photo-sensor 131a is connected with its corresponding vertical signal line 135 and a position where the photo-sensor 131b below that photo-sensor 131a in the figure is connected with its corresponding vertical signal line 135. Therefore, the vertical signal line 135 corresponding to the photo-sensor 131a is spaced from the photo-sensor 131b at a position below the photo-sensor 131a by as much as one pixel in the figure, so that in the resultant gap there is provided the vertical signal line 135 corresponding to the lower side photo-sensor 131b. In the figure, between the two photo-sensors 131 adjacent each other horizontally, not more than seven vertical signal lines 135 are present.

To each of the vertical signal lines 135 are linked 60 capacitors 139 for storing and recording an electric signal at an even spacing. Between each capacitor 139 and the vertical signal line 135 is interposed a selecting gate 141.

Each vertical signal line 135, on the upper side in the figure, is provided with an input gate 143 for communicating with or blocking the corresponding photo-sensor 131 (see FIG. 16).

On the other hand, each vertical signal line 135, on the lower end side in the figure, is provided with a read-out/reset gate 145. Also, at the lower end of each vertical signal line 135, a horizontal read-out line 147 is connected. This horizontal read-out line 147 extends horizontally in the figure and is connected to the read-out circuit out of the light receptive area. Each read-out line 147 is provided with a horizontal-signal read-out line selecting gate 149 out of the light-receptive area.

In the figure, the selecting gates 141 of the capacitors 139 horizontally arrayed (i.e., capacitors 139 allocated same number selected from "1" through "60" in FIG. 17) is connected to a recording position selecting control line 151 which extends horizontally in the figure.

The input gate 143 of each vertical signal line 135 is each opened and closed by a voltage supplied from a shift register (not shown) via an input-gate control line 153 which extends vertically in the figure. The input gates 143 of vertical signal lines 135 which corresponds to the photo-sensors 131 vertically arrayed in the figure on the light receptive area are connected to the same input-gate control line 153.

The read-out/reset gate 145 of each vertical signal line 135 is each opened and closed by a voltage supplied from another shift register (not shown) via a read-out/reset gate control line 155 which extends vertically in the figure. The readout/reset gates 145 of the vertical signal lines 135 which correspond to the photo-sensors 131 arrayed vertically in the figure on the light receptive area are connected to the same read-out/reset gate control line 155.

Each horizontal signal read-out line selecting gate 149 is opened and closed by a voltage supplied from a shift register (not shown) via a horizontal signal read-out line selecting gate control line 157 which extends horizontally in the figure. The horizontal signal read-out line selecting gates 149 which correspond to the photo-sensors 131 arrayed horizontally on the light receptive area in the figure are connected to the same horizontal signal read-out line selecting gate control line 157.

The stack construction of the light receptive area will be described. On a first layer provided on an upper surface of a substrate (not shown), the photo-sensors 131, the capacitors 139, the recording position selecting gates 141, the input gates 143, the read-out/reset gates 145, and the horizontal signal read-out line selecting gates 149 are provided. On a second layer, metal wires vertically extending in the figure, i.e. vertical signal lines 135, the input gate control lines 153, and the read-out/reset gate control lines 155 are provided. On a third layer, metal wires horizontally extending in the figure, i.e. horizontal signal read-out lines 147, the recording position selecting control lines 151, and the horizontal signal read-out line selecting gate control lines 157 are provided. Above the third layer is provided a light blocking surface (not shown) for preventing the incidence of light to anywhere other than to the photo-sensors 131.

The following will describe operations of the image sensor according to the fourth embodiment. In image sensing, first, all the input gate control lines 153 are provided a voltage to open all the input gates 143. In this state, for each of the photo-sensors 131 of the pixels 129 arrayed horizontally on the light receptive area, a voltage is fed to the recording position selecting control line 151 located at the top side in the figure (i.e., recording position selecting control line 151 for opening and closing the selecting gate 141 of the capacitor 139 indicated by "1" in the figure). As a result, electric signals generated at the four photodiodes 130a through 130d of each photo-sensor 131 are amplified at the amplifiers 133a through 133d and then recorded via the input gate 143, the vertical signal line 135, and the recording position selecting gate 141 to the capacitor 139 indicated by "1". Similarly, a voltage is sequentially fed to the recording position selecting control lines 151 which correspond to the recording position selecting gates 141 of the capacitors 139 indicated by "2" through "60". As a result, for each of the photo-sensors 1.31, the electric signal is recorded at the capacitors 139 indicated "1" through "60" in this order.

After the electric signal is recorded at all the capacitors 139 of "1" through "60", in order to record electric signals corresponding to the next image (61st image), following operation is executed. First, the input gates 143 are closed, and the read-out/reset gates 145 and the horizontal signal read-out line selecting gates 149 are opened, then the selecting gates 149 corresponding to the capacitors 139 indicated by "1" are opened. As a result, electric signals stored at the "1" capacitors 139 are discharged to the outside of the light receptive area via the selecting gates 141, the vertical signal lines 135, the read-out/reset control lines 145, the read-out lines 147, and the horizontal signal read-out line selecting gates 149. Next, the read-out/reset gates 145 and the horizontal signal read-out line selecting gates 149 are closed, and the input gates 143 are opened and then the selecting gates 141 of the "1" capacitors 139 are opened. As the result of this, electric signals corresponding to the 61st image which generated in the photo-sensors 131 are recorded at the "1" capacitors 139. These operations are sequentially repeated with respect to capacitors 139 of "2" through "60" for each photo-sensor 131, achieving continuous overwrite image sensing.

If a phenomenon to be captured occurs, the continuous overwriting is stopped in the same manner as the first embodiment.

Operation for reading out the electric signal stored at each capacitor 139 after the continuous overwrite image sensing will be described. First a voltage is fed to one of the horizontal signal read-out line selecting gate control lines 157, to open all the horizontal signal line read-out line selecting gates 149 under its control. By this operation, electric signals can be read out from the pixels 129 constituting a horizontal row in the figure. Further, a voltage is fed to one of the read-out/reset gate control lines 155, to open all the read-out/reset gates 145 under its control. By this operation, electric signals can be read out from pixels 129 constituting a vertical row in the figure. By thus feeding the voltage to the one horizontal read-out line selecting gate 157 and the one read-out/reset gate control line 155, electric signals can be read from one pixel 129. In this state, for that one pixel 129, a voltage is sequentially fed to the recording position selecting control lines 151 starting from the top one in the figure. As a result, electric signals stored in the capacitors 139 of "1" through "60" are read out in this order to the outside of the light receptive area via the recording position selecting gate 141, the vertical signal line 135, the read-out/reset gate 145, the horizontal signal read-out line 147, and the horizontal signal read-out lien selecting gate 149. Similarly, the read-out/reset gate control lines 155 and the horizontal signal read-out line selecting gate control lines 157 are sequentially scanned horizontally and vertically respectively, to select one pixel 129 each, thus reading out electric signals recorded at the capacitors of "1" through "60" which correspond to thus selected pixels 129.

In order to discharge electric signals stored in all the capacitors 139 of each photo-sensor 131 for resetting, the read-out/reset gates 145 and the horizontal signal read-out line selecting gates 149 are all opened and, at the same time, the recording position selecting gates 141 are all opened at once. The electric signals stored at each capacitor 139 are discharged out of the image sensor via the recording position selecting gates 141, the vertical signal lines 135, the read-out/reset gates 145, the read-out lines 147, and the horizontal signal read-out line selecting gates 149.

In intermittent monitoring for image sensing conditions setting, all the selecting gates 141 are held in a closed state. Also, all the input gates 143 are held in an open state. Then, at a predetermined interval (e.g., 1/30 second), an electric signal is read out of each photo-sensor 131. Vertical scanning is performed by sequentially applying a voltage to the read-out/selecting gate control lines 157 one by one, while horizontal scanning is performed by sequentially applying a voltage to the read-out/reset gate control lines 155 one by one. Alternatively, with the horizontal signal read-out line selecting gates 149 held in an open state, a voltage is sequentially applied to the input gate control lines 153 one by one, to perform horizontal scanning.

Fifth Embodiment

Figure 18:
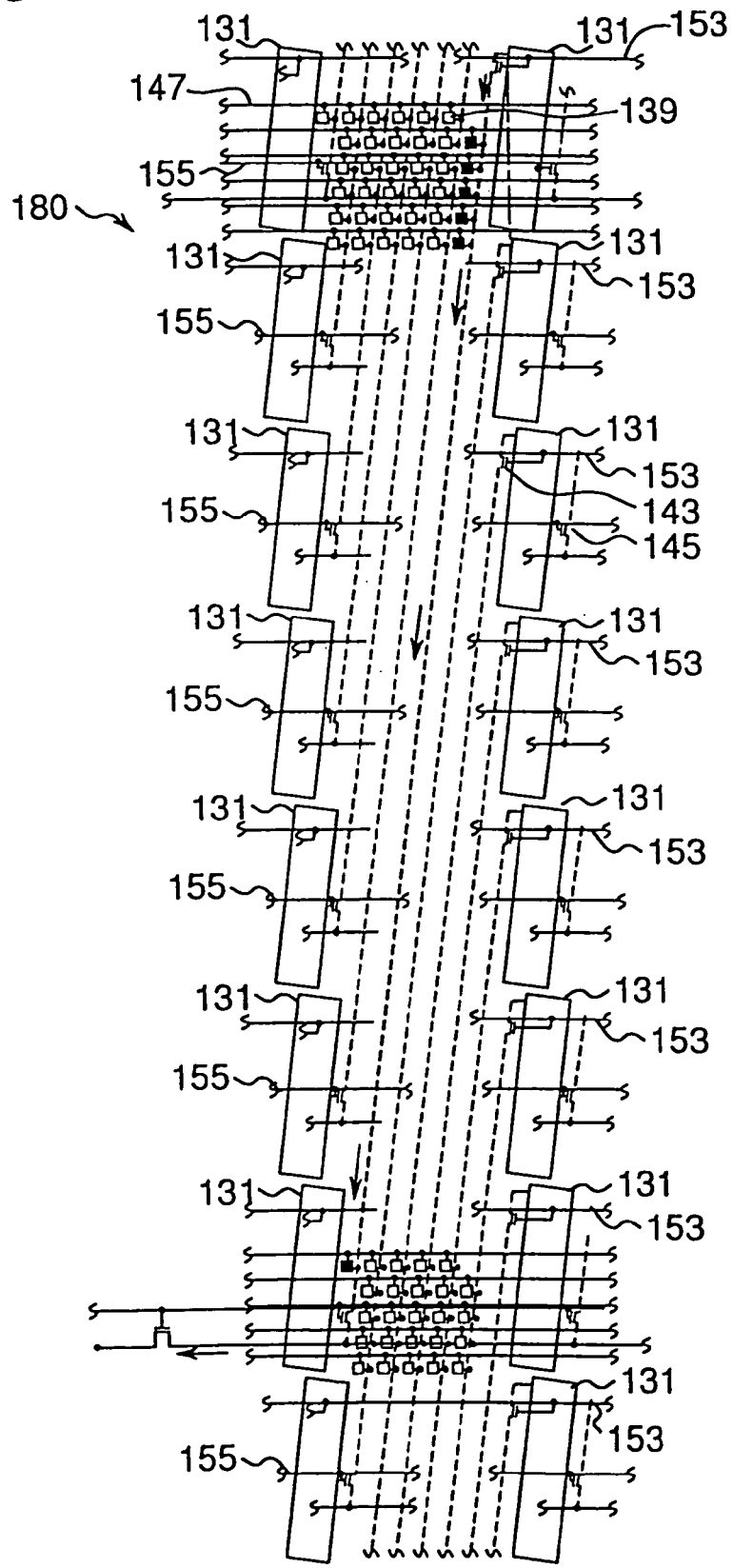
FIG. 18 is a schematic front view showing an image sensor according to the fifth embodiment.

In a image sensor 180 according to a fifth embodiment of the present invention shown in FIG. 18, the input gate control lines 153 and the read-out/reset gate control lines 155 horizontally extend from the left end to the right end on the light receptive area in the figure. As the result of this arrangement, in the fifth embodiment, of all the metal wires, the input gate control lines 153, the read-out/reset gate control lines 155, the horizontal signal read out lines 147, the recording position selecting control lines 151, and the horizontal signal read-out line selecting gate control lines 157 extend horizontally, while only the vertical signal lines 135 which correspond to each of the photo-sensors 131 extend vertically. Each vertical signal line 135 does not extend from the upper end to the lower end of the light receptive area but extends downward from the corresponding photo-sensor 131 by as long as six pixels 129 and is connected and terminated at the corresponding horizontal signal read-out line 147. Thus, in the image sensor according to the fifth embodiment, the metal wired connecting to the outside of the light receptive area, i.e. the input gate control lines 153, the read-out/reset gate control lines 155, the horizontal signal read-out lines 147, the recording position selecting control lines 151, and the horizontal signal read-out line selecting gate control lines 157 all extend horizontally. Therefore, as shown in FIG. 19, it is possible to dispose pull-out portions of these lines from the light receptive area to the left side in the figure and collectively arrange such circuits as shift registers in a portion 180a situated at left side of the light receptive area.

Figure 19:
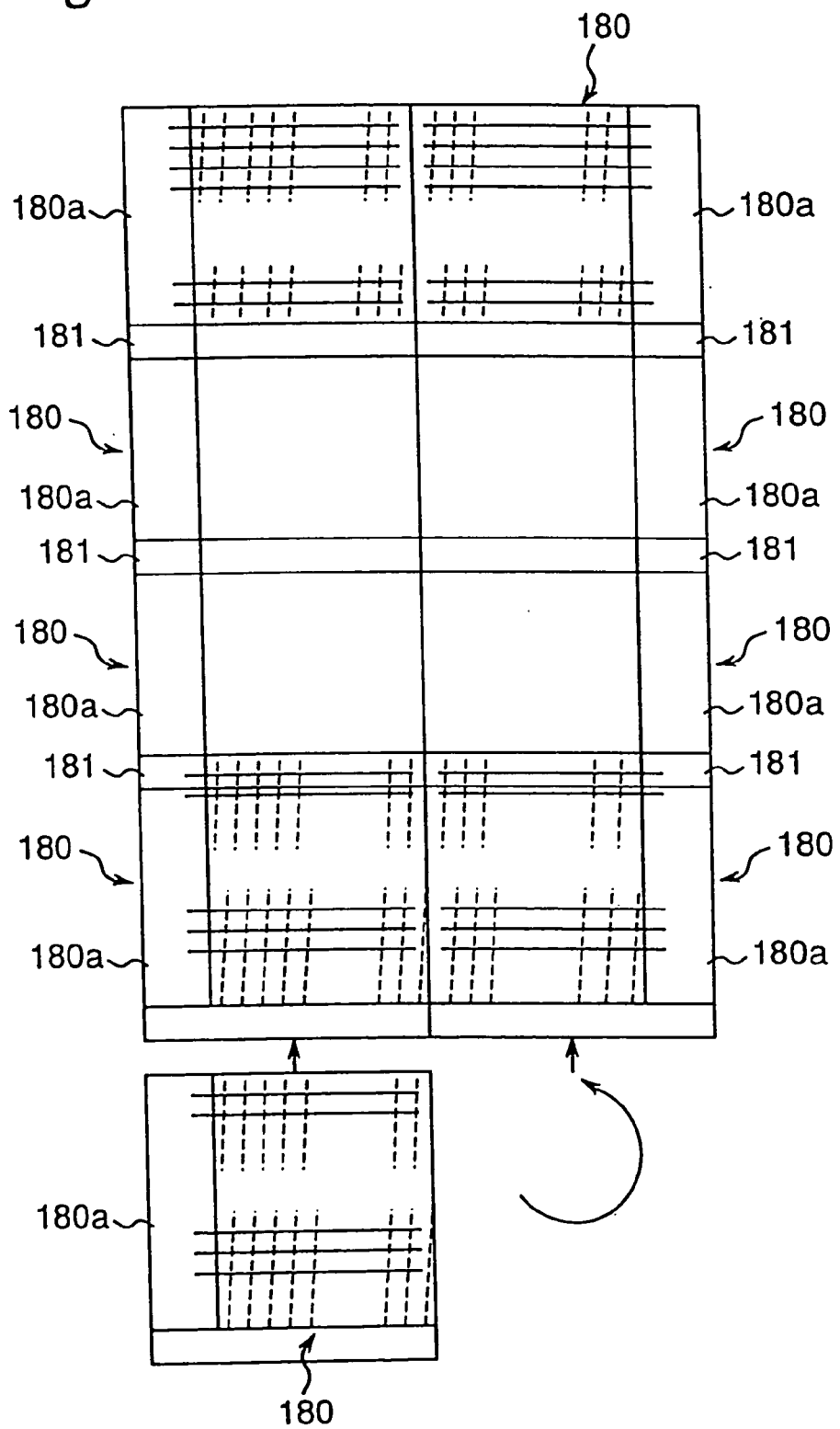
FIG. 19 is a schematic front view showing a state where the image sensors of the fifth embodiment are incorporated.

With such a configuration, for example, as shown in FIG. 19, a total of eight image sensors 180 can be arranged horizontally in two rows and vertically in four column, to make up a high-resolution image sensor equipped with one large area light receptive area. In this case, it is enough that the eight image sensors 180 should have the same configuration and also that with respect to the left side columns of the image sensors, the right side columns of the image sensors should be inverted by 180 degrees in arrangement.

At the lower side portion of each image sensor 180 in the figure are present only the vertical signal lines 135, the capacitors 39, etc. which correspond to photo-sensors 131 of the lowest row in the light receptive area but not the photo-sensors 131. Therefore, to array the image sensors vertically, it is necessary to provide a region 181 at which are superposed the lower side portion of the upper side image sensor 180 and the upper side portion of the lower side image sensor 180 with an insulation layer (not shown) interposed therebetween. This region 181 becomes thick as compared to the other portions of each image sensor 180 but the pixel size is large as compared to the increase in the thickness, thus preventing the occurrence of defocusing.

In the image sensor with such a configuration as shown in FIG. 19, at the time of continuous overwrite image sensing, a total of discharged electric signals for overwriting out of all pixels of each image sensor 180 is monitored, so that if the total of the discharged electric signals changes rapidly, overwriting may be stopped. With such a operation, it is possible to obtain a trigger function for stopping continuous overwrite image sensing if a rapid change occurred at a ⅛-size region of the image without incorporating any special mechanism.

The fifth embodiment is the same as the fourth embodiment in the other configurations and operations, with the same reference numerals indicating the same elements.

Sixth Embodiment

Figure 20:
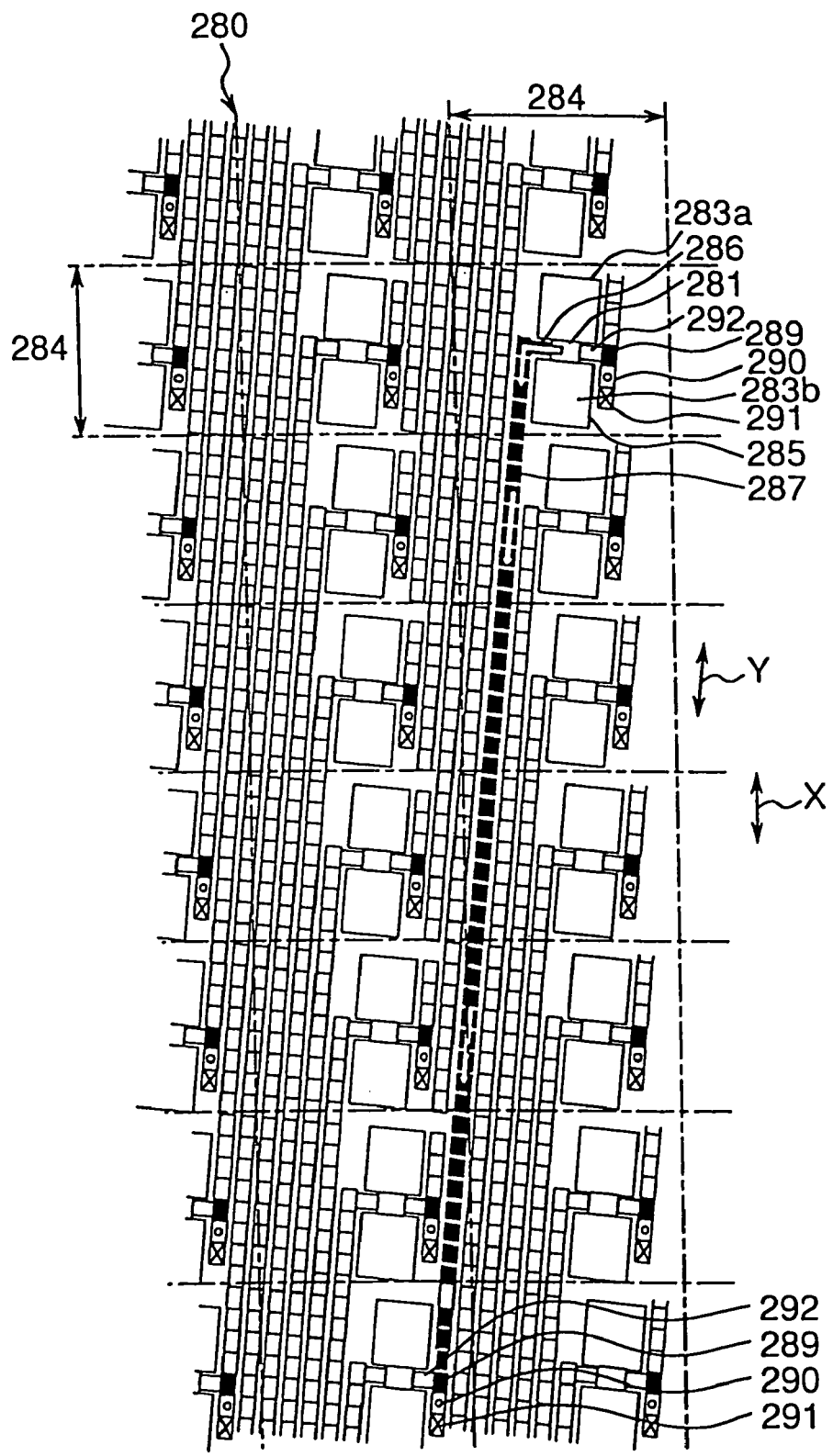
FIG. 20 is a partially enlarged front view showing an image sensor according to the sixth embodiment of the present invention.

FIGS. 20 and 21 show a sixth embodiment of the present invention.

As shown in FIG. 20, in a image sensor according to this sixth embodiment, one pair of photodiodes 283a and 283b connected on the upper and lower sides of a charge collecting well 281 constitute a photo-sensor 285 of each pixel 284. The charge collecting well 281 is connected via an input gate 286 to a CCD transfer path 287 which straightly extends as long as six pixels. On the lower side of the CCD transfer path 287 in the figure are provided a buffer/drain gate 289, an amplifier 290, and a reset gate 291. The buffer/drain gate 289 is connected via an overflow/reset gate 292 to the charge collecting well 281 within another pixel 294 which is six pixels downward and one pixel leftward in FIG. 20 with respect to the pixel 284 provided with the photo-sensor 285 whose electric signals are recorded in the CCD transfer path 287.

In the sixth embodiment, with respect to a vertical array direction of the squarely arrayed pixels 284 (indicated by an arrow×in the figure), both an extension direction of the CCD transfer paths 287 and the array direction of the of the pair of photodiodes 283a and 283b constituting each photo-sensor 285 (indicated by the arrow Y in the figure) are inclined. Therefore, the CCD transfer path 287 which corresponds to each photo-sensor 285, as extending downward in the figure, is spaced from a photo-sensor 285 disposed below that photo-sensor 285 in the figure, so that at a resultant gap, the CCD transfer path corresponding to the lower side photo-sensor 285 can be disposed.

Further, in the sixth embodiment, since each photo-sensor 285 consists of two photodiodes 283a and 283b, even if a potential gradient is given to each of the photodiodes 283a and 283b in order to accelerate charge collection, its potential difference with the CCD transfer path 287 does not become large, thus enabling sending an electric signals generated at the photodiodes 283a and 283b securely to the CCD transfer path 287. Furthermore, since each photodiode can be sized into a small area, a presently available and time-proven photodiode can be used which measures a few microns and more than 10 microns at each side.

Figure 21A:
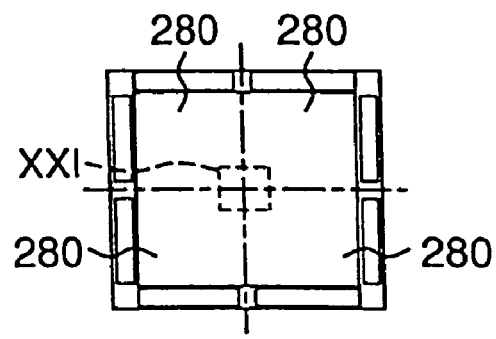
FIG. 21A is a schematic front view showing a state where the image sensors according to the sixth embodiment are incorporated.
Figure 21B:
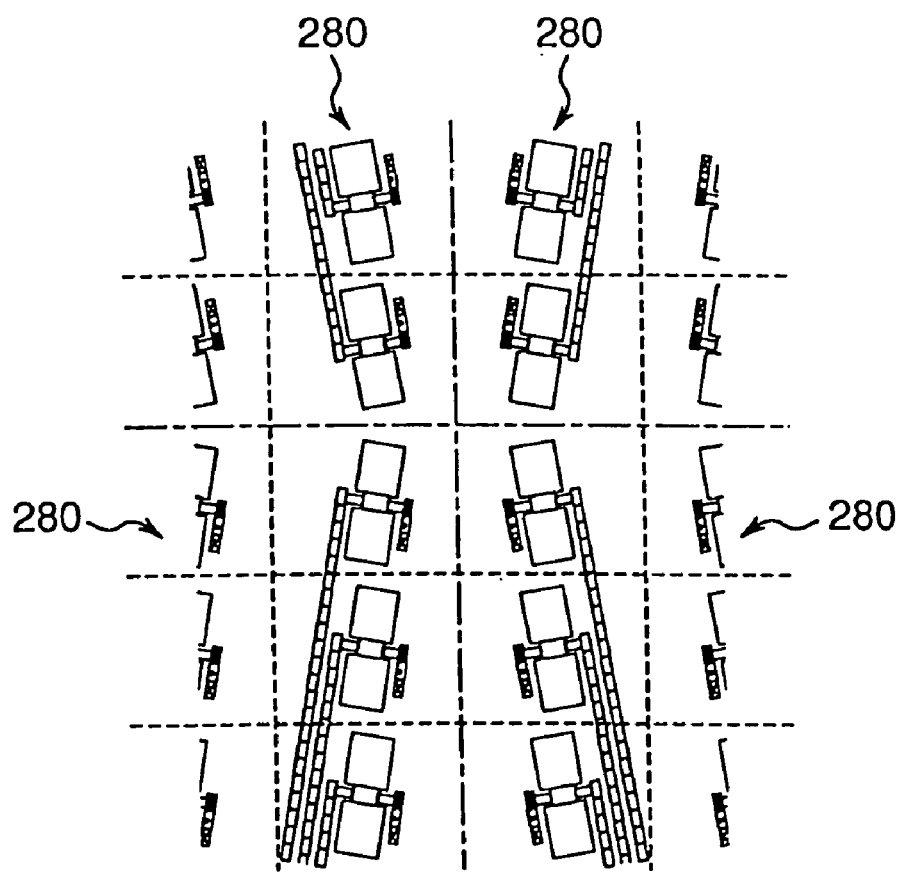
FIG. 21B is an enlarged view of an essential portion of a part XXIV of FIG. 21A.

In the image sensor 280 according to the sixth embodiment, it is possible to collectively dispose circuits such as shift registers left outside to the light receptive area in FIG. 20, thus obtaining a region free of circuits such as shift registers to the upper and lower outsides and right outside to the light receptive area. Thus, as shown in FIGS. 21A and 21B, the image sensor according to the sixth embodiment may be combined four into an image sensor having one large-area light receptive area. It should be noted that the number of the image sensor thus combined is not limited to four. For example, eight image sensors may be combined where four of them are turned 180 degrees-like in the case of the fifth embodiment shown in FIG. 19.

Seventh Embodiment

Figure 22:
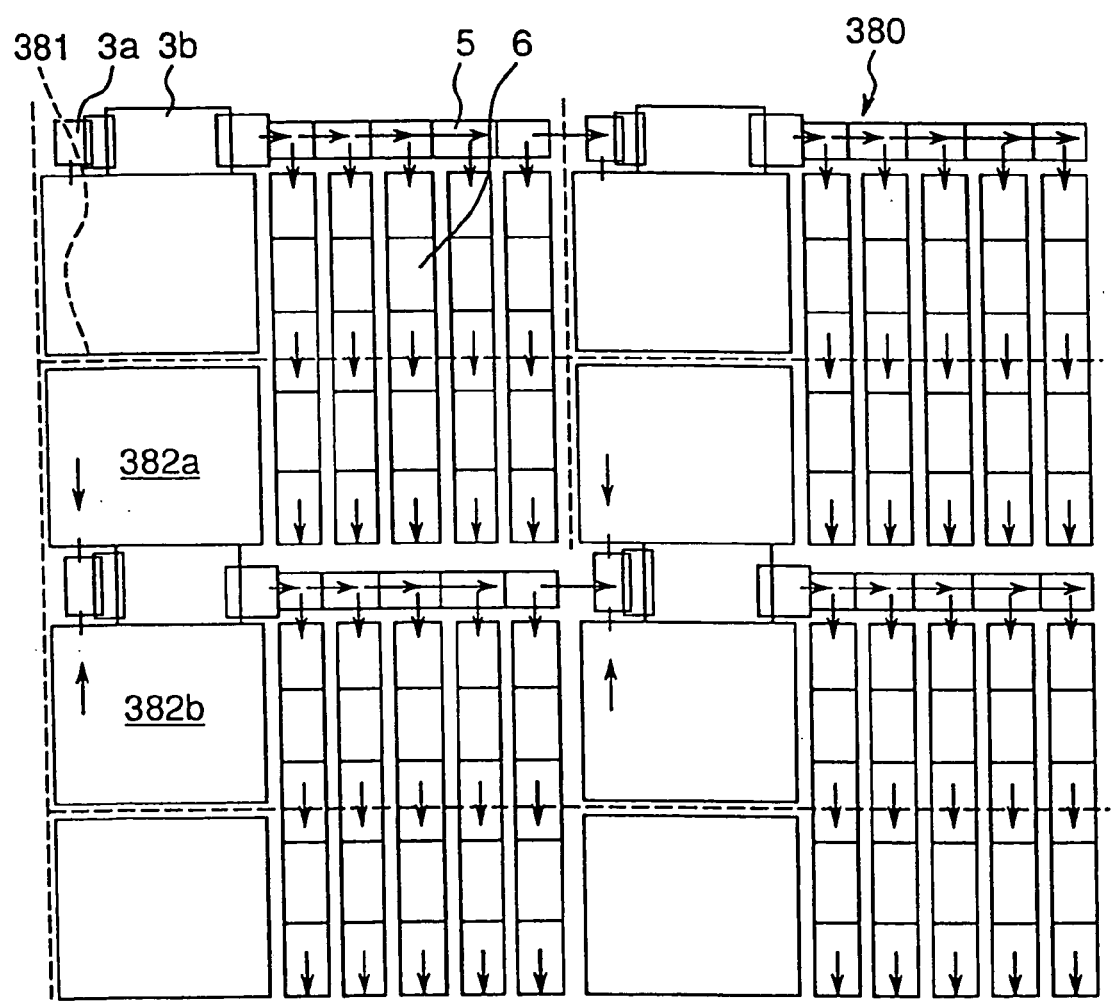
FIG. 22 is a partial enlarged schematic front view showing an image sensor according to the seventh embodiment of the present invention.

FIG. 22 shows an image sensor 380 according to a seventh embodiment of the present invention.

Figure 23:
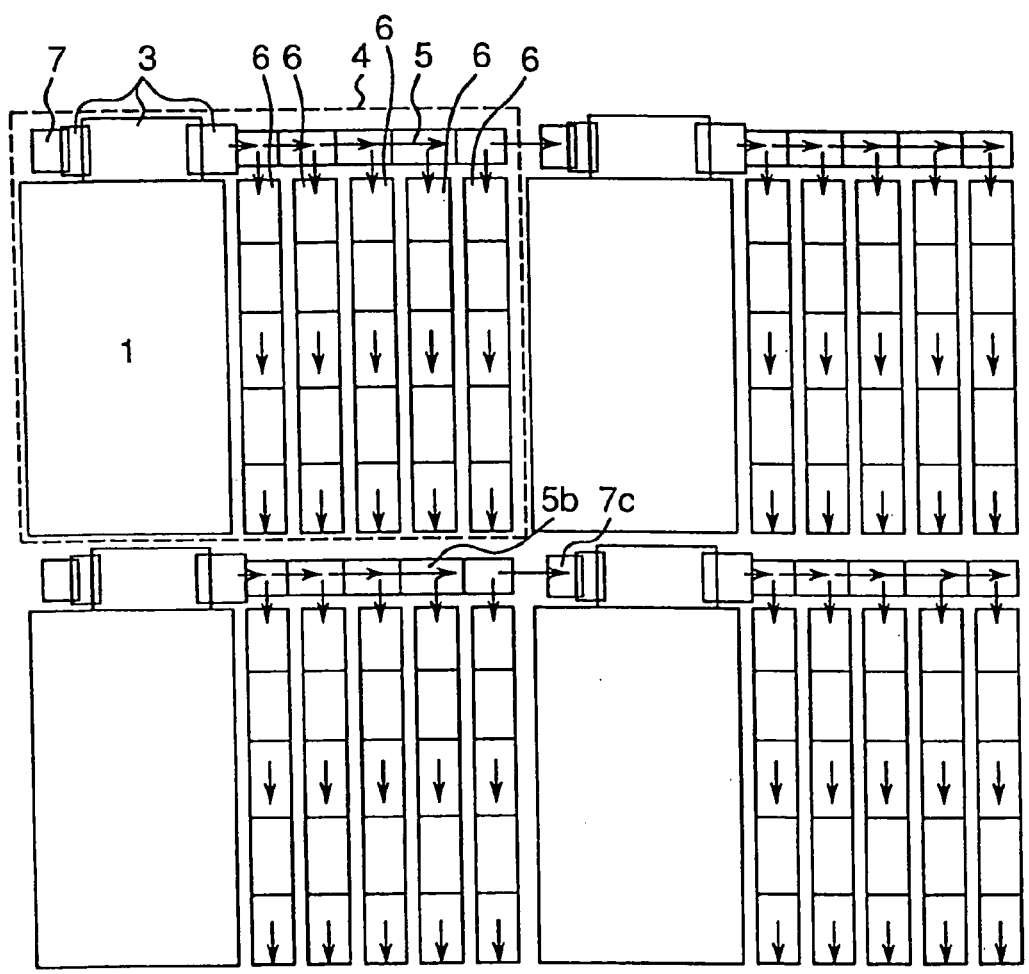
FIG. 23 is a partial schematic front view showing a conventional high-speed image sensor.

This image sensor 380 has almost the same configuration as that by Kosonocky et al. shown in FIG. 23 except that for each pixel 381 are provided two photodiodes 382a and 382b, which are connected via one charge collecting well 3a and an input gate 3b to CCD transfer paths 5 and 6. With such a configuration, even if a potential gradient is given at each of the photodiodes 382a and 382b in order to accelerate charge collection, its potential difference with the CCD transfer path 5 does not become large, thus making it possible to send a generated electric signal securely to a CCD transfer path 5 and also to use a presently available and time-proven photodiode which measure a few microns or more than 10 microns at each side.

The configuration of horizontal CCDs for reading out provided out of the light receptive area, camera, etc. throughout the first to seventh embodiments is a typical one and described also in the specification of the prior-art referred to here or literatures (e.g., "Introduction to CCD Camera Technologies" by Hiroo Tekemura, Corona Inc.). Therefore, its description is omitted.

What is claimed is:

1. A high-speed image sensor, comprising:
a plurality of signal converters for generating electric signals according to an incident light intensity;
a plurality of longitudinal sections of electric signal storage devices, each of said longitudinal sections comprising a plurality of linearly shaped electric signal storage devices for storing electric signals output from corresponding signal converters;
a plurality of drain gates, each provided at the output of one of said longitudinal sections, each drain gate for discharging electric signals generated by an associated signal converter to a drain line connected to each said drain gate; and
a read-out circuit connected to said drain line for directly reading-out a read-out signal from said longitudinal sections.

2. The high-speed image sensor of claim 1, further comprising connectors for directly connecting said signal converters with the read-out lines without passing through said electric signal recorders.

3. The high-speed image sensor of claim 1, wherein each said electric signal recorder is a charge coupled device type electric signal recorder.

4. The high-speed image sensor of claim 1, wherein each said electric signal recorder is a MOS type electric signal recorder.

5. The high-speed image sensor of claim 1, wherein each of said signal converters is divided into a plurality of portions insulated from each other.

6. The high-speed image sensor of claim 4, wherein each of said signal converters is divided into a plurality of portions insulated from each other and wherein amplifiers for amplifying the electric signals are interposed between said plurality of divided portions and said electric signal recorders.

7. A high-speed image sensor, comprising
a plurality of signal converters for generating electric signals according to an intensity of electromagnetic waves or particle streams; and
a plurality of longitudinal sections of linear shaped electric signal storage devices, each of said longitudinal sections comprising a plurality of said electric signal storage devices for storing electric signals output from corresponding signal converters;
a plurality of drain gates, each said drain gate connected to the output of one longitudinal section, for discharging electric signals generated by said signal converters;
a drain line connected to said drain gates, wherein a read-out signal is directly read-out from said longitudinal sections using said drain line.

8. The high-speed image sensor of claim 7, wherein each said electric signal recorder is a charge coupled device type electric signal recorder.

9. The high-speed image sensor of claim 7, wherein each said electric signal recorder is a MOS type electric signal recorder.

10. The high-speed image sensor of claim 7, wherein each of said signal converters is divided into a plurality of portions insulated from each other.

11. The high-speed image sensor of claim 9, wherein each of said signal converters is divided into a plurality of portions insulated from each other and wherein amplifiers for amplifying the electric signals are interposed between said plurality of divided portions and said electric signal recorders.

12. The high-speed image sensor of claim 7, further comprising a cuttable band-shaped space which continuously extends from one side to another side of the light receptive area.

13. A high-speed image sensor comprising a plurality of signal converters for generating electric signals according to an incident light intensity and a plurality of electric signal recorders for storing electric signals output from corresponding signal converters, wherein said signal converters are disposed in all of, or every other, square or rectangular frames on a light receptive area; and wherein a center line of each said electric signal recorder, in a direction from one position where electric signals are input from a signal converter to another position where electric signals are input from an adjacent signal converter, is inclined with respect to a line connecting two positions where electric signals are input from two of said signal converters, adjacent to each other in an extension direction of said electric signal recorders, to corresponding electric signal recorders.

14. The high-speed image sensor of claim 13, wherein each said electric signal recorder is a charge coupled device type electric signal recorder.

15. The high-speed image sensor of claim 13, wherein each said electric signal recorder is a MOS type electric signal recorder.

16. The high-speed image sensor of claim 13, wherein each of said signal converters is divided into a plurality of portions insulated from each other.

17. The high-speed image sensor of claim 15, wherein each of said signal converters is divided into a plurality of portions insulated from each other and wherein amplifiers for amplifying the electric signals are interposed between said plurality of divided portions and said electric signal recorders.

18. The high-speed image sensor of claim 13, further comprising a cuttable band-shaped space which continuously extends from one side to another side of the light receptive area.

19. An image sensing apparatus comprising said high-speed image sensor claimed in claim 1.

20. An image sensing apparatus comprising said high-speed image sensor claimed in claim 7.

21. An image sensing apparatus comprising said high-speed image sensor claimed in claim 13.

22. A high-speed image sensor, comprising:

a plurality of signal converters for generating electric signals according to an incident light intensity;

a plurality of longitudinal sections of electric signal storage devices, each of said longitudinal sections comprising a plurality of electric signal storage devices for storing electric signals output from corresponding signal converters;

a plurality of drain lines, each provided at the output of one of said longitudinal sections, for discharging electric signals generated by said plurality of signal converters; and a read-out circuit connected to said drain lines for directly reading-out a read-out signal from said longitudinal sections.

23. A high-speed image sensor, comprising:

a plurality of signal converters for generating electric signals according to an intensity of electromagnetic waves or particle streams; and a plurality of longitudinal sections of electric signal storage devices, each of said longitudinal sections comprising a plurality of said electric signal storage devices for storing electric signals output from corresponding signal converters;

a drain line connected to the output of each said longitudinal section for discharging electric signals generated by said signal converters, wherein a read-out signal is directly read-out from said longitudinal sections using said drain line.

* * * * *